(12) United States Patent
Motoi et al.

(10) Patent No.: US 7,842,557 B2
(45) Date of Patent: Nov. 30, 2010

(54) NONVOLATILE STORAGE DEVICE AND METHOD OF MANUFACTURING THE SAME, AND STORAGE DEVICE AND METHOD OF MANUFACTURING THE SAME

(75) Inventors: Yuichi Motoi, Kanagawa (JP); Katsuyuki Naito, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/249,688

(22) Filed: Oct. 10, 2008

(65) Prior Publication Data
US 2009/0042340 A1    Feb. 12, 2009

Related U.S. Application Data

(62) Division of application No. 11/533,648, filed on Sep. 20, 2006, now Pat. No. 7,486,553.

(30) Foreign Application Priority Data

Dec. 1, 2005    (JP)    ............... 2005-348230

(51) Int. Cl.
*H01L 21/82*    (2006.01)
(52) U.S. Cl. ..................................... 438/130
(58) Field of Classification Search .................. 438/130
See application file for complete search history.

(56) References Cited

U.S. PATENT DOCUMENTS

| 6,937,447 | B2 | 8/2005 | Okuno et al. |
| 2002/0067634 | A1 | 6/2002 | Gibson |

| 2004/0200368 | A1 | 10/2004 | Ogino et al. |
| 2004/0252590 | A1 | 12/2004 | Sharma |

(Continued)

FOREIGN PATENT DOCUMENTS

JP    6-252410    9/1994

(Continued)

OTHER PUBLICATIONS

Ito, Takashi "Pushing the limits of lithography" NATURE vol. 406, Aug. 31, 2000 pp. 1027-1031.*

(Continued)

*Primary Examiner*—N Drew Richards
*Assistant Examiner*—Grant S Withers
(74) *Attorney, Agent, or Firm*—Oblon, Spivak, McClelland, Maier & Neustadt, L.L.P.

(57) ABSTRACT

A nonvolatile storage device includes a plurality of bit lines 21 arranged in a column direction on a substrate; a plurality of word lines 35 arranged in a row direction on the substrate; a memory cell array 20 having a plurality of memory cells 31, where a store state of each of the memory cells 31 changes according to an electric signal relatively applied to the word line 35 and the bit line 21; a word line selection unit having a needle 51 relatively movable with respect to the substrate which comes into contact with one word line 35, setting the word line 35 in contact with the needle 51 to a selection state; and a sense amplifier 48 detecting through the bit line an electrical signal exhibiting the store state of the memory cell 31 to be connected to the word line.

1 Claim, 26 Drawing Sheets

U.S. PATENT DOCUMENTS

| | | |
|---|---|---|
| 2005/0121659 A1 | 6/2005 | Tanaka et al. |
| 2005/0136597 A1 | 6/2005 | Shinada et al. |
| 2005/0219767 A1 | 10/2005 | Nakamura et al. |
| 2006/0091437 A1 | 5/2006 | Hong et al. |
| 2006/0092542 A1 | 5/2006 | Ushida et al. |
| 2006/0211154 A1 | 9/2006 | Buehlmann et al. |

FOREIGN PATENT DOCUMENTS

| | | |
|---|---|---|
| JP | 6-325579 | 11/1994 |
| JP | 2001-168306 | 6/2001 |
| JP | 2002-82414 | 3/2002 |
| JP | 2002-222930 | 8/2002 |
| JP | 2004-186252 | 7/2004 |
| JP | 2004-241558 | 8/2004 |
| JP | 2004-288845 | 10/2004 |
| JP | 2005-5718 | 1/2005 |
| JP | 2005-183763 | 7/2005 |
| JP | 2006-269056 | 10/2006 |
| WO | WO 03/085740 A1 | 10/2003 |

OTHER PUBLICATIONS

Michel Despont, et al., "Wafer-Scale Microdevice Transfer/Interconnect: Its Application in an AFM-Based Data-Storage System," Journal of Microelectromechanical Systems, vol. 13, No. 6, Dec. 2004, pp. 895-901.

H. Pozidis, et al., "Demonstraction of Themomechanical Recording at 641 Gbit/in2," IEEE Transactions on Magnetics, vol. 40, No. 4, Jul. 2004, pp. 2531-2536.

H. Jonathon Mamin, et al., "High-Density Data Storage Based on the Atomic Force Microscope," Proceedings of the IEEE, vol. 87, No. 6, Jun. 1999, pp. 1014-1027.

"The "Millipede" Project," IBM, URL: http://www.zurich.ibm.com/st/storage/millipede.html.

\* cited by examiner

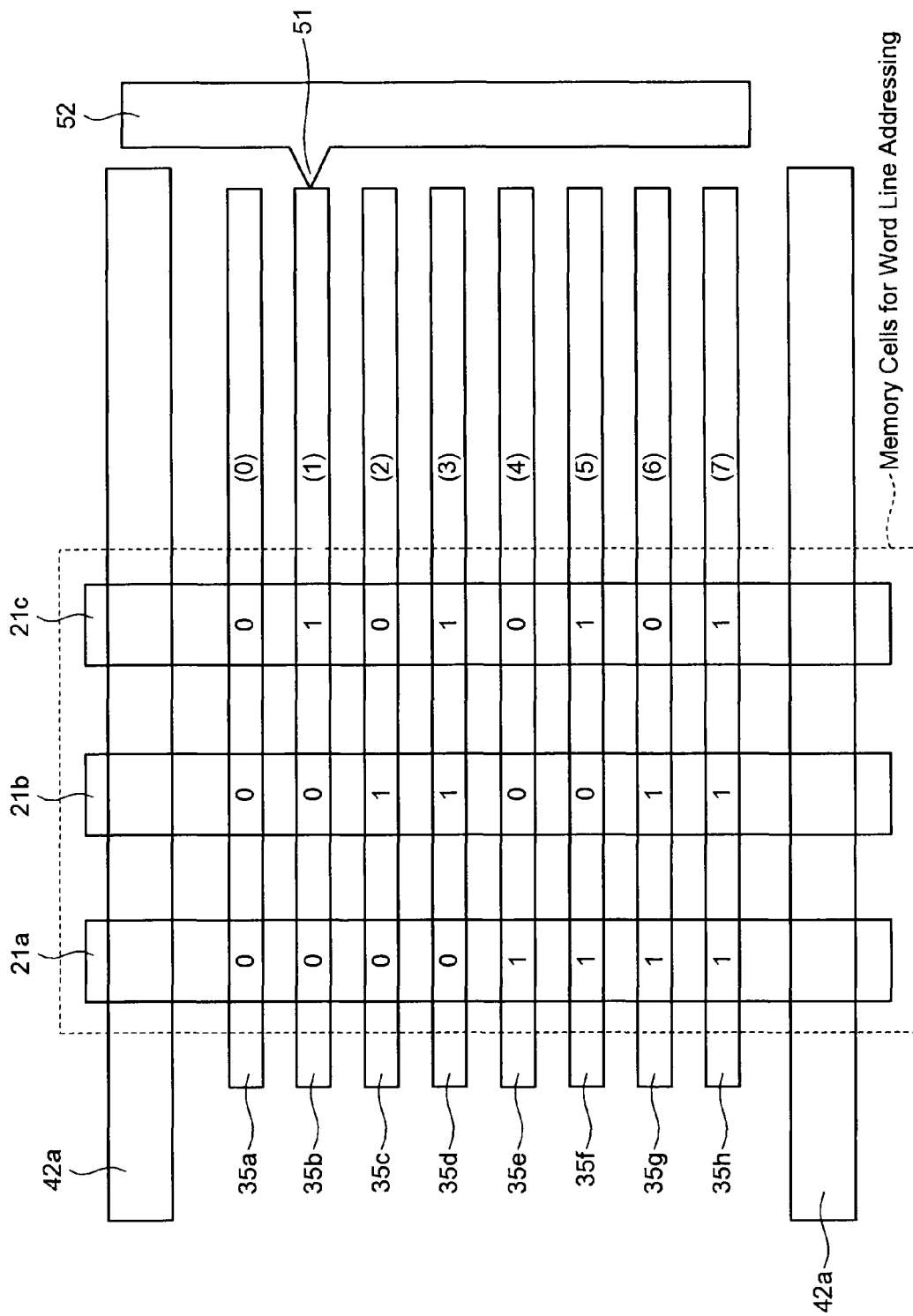

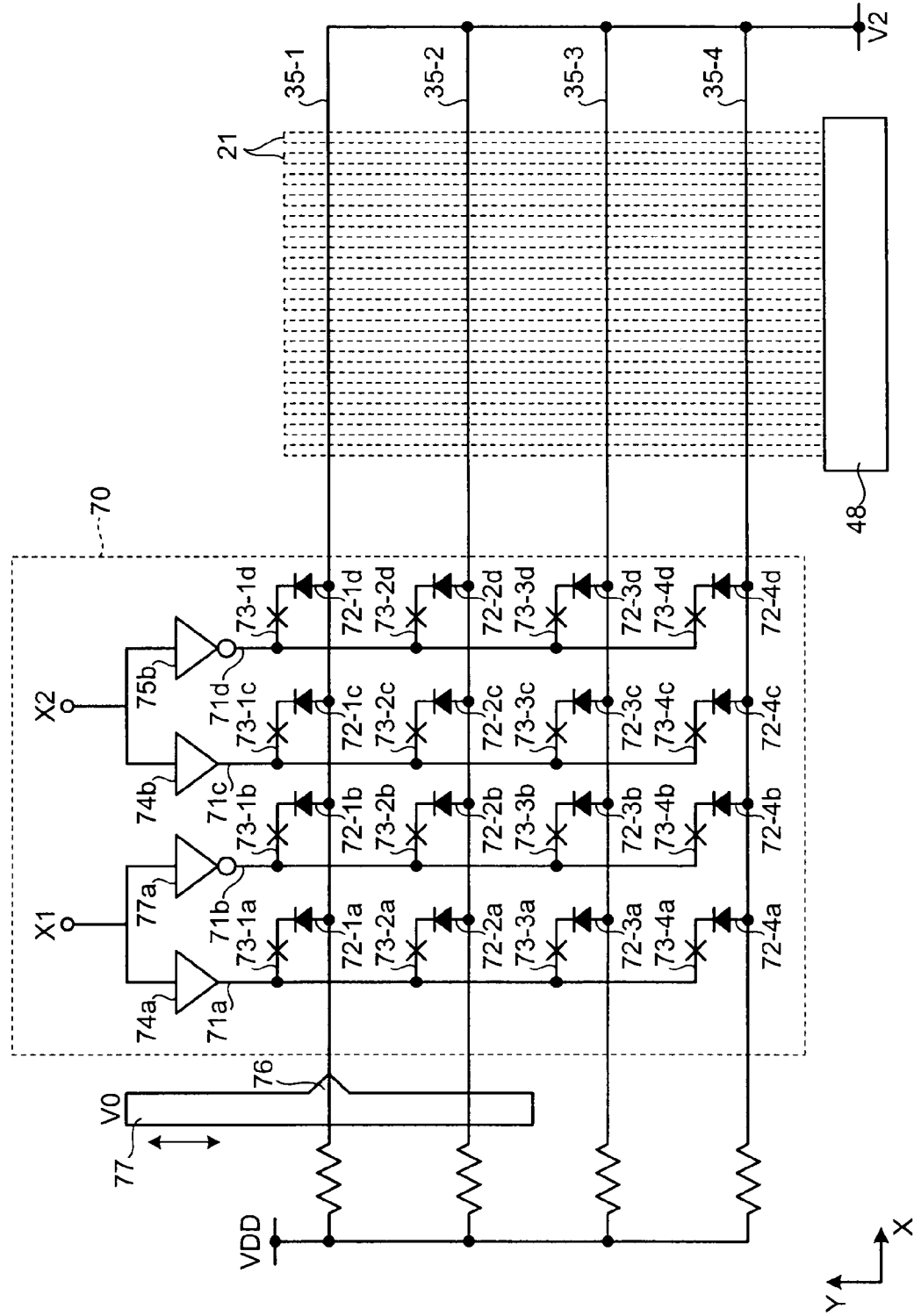

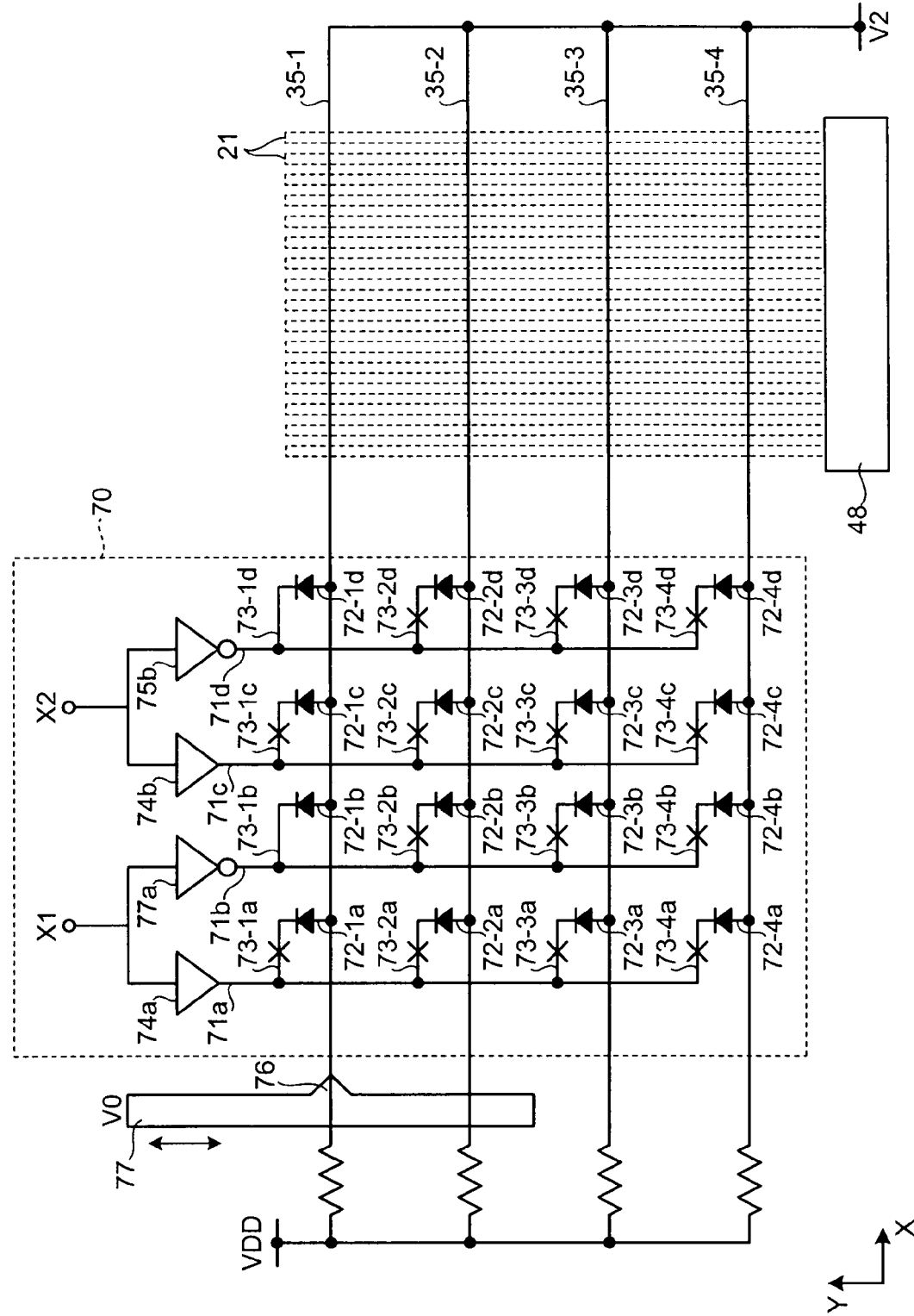

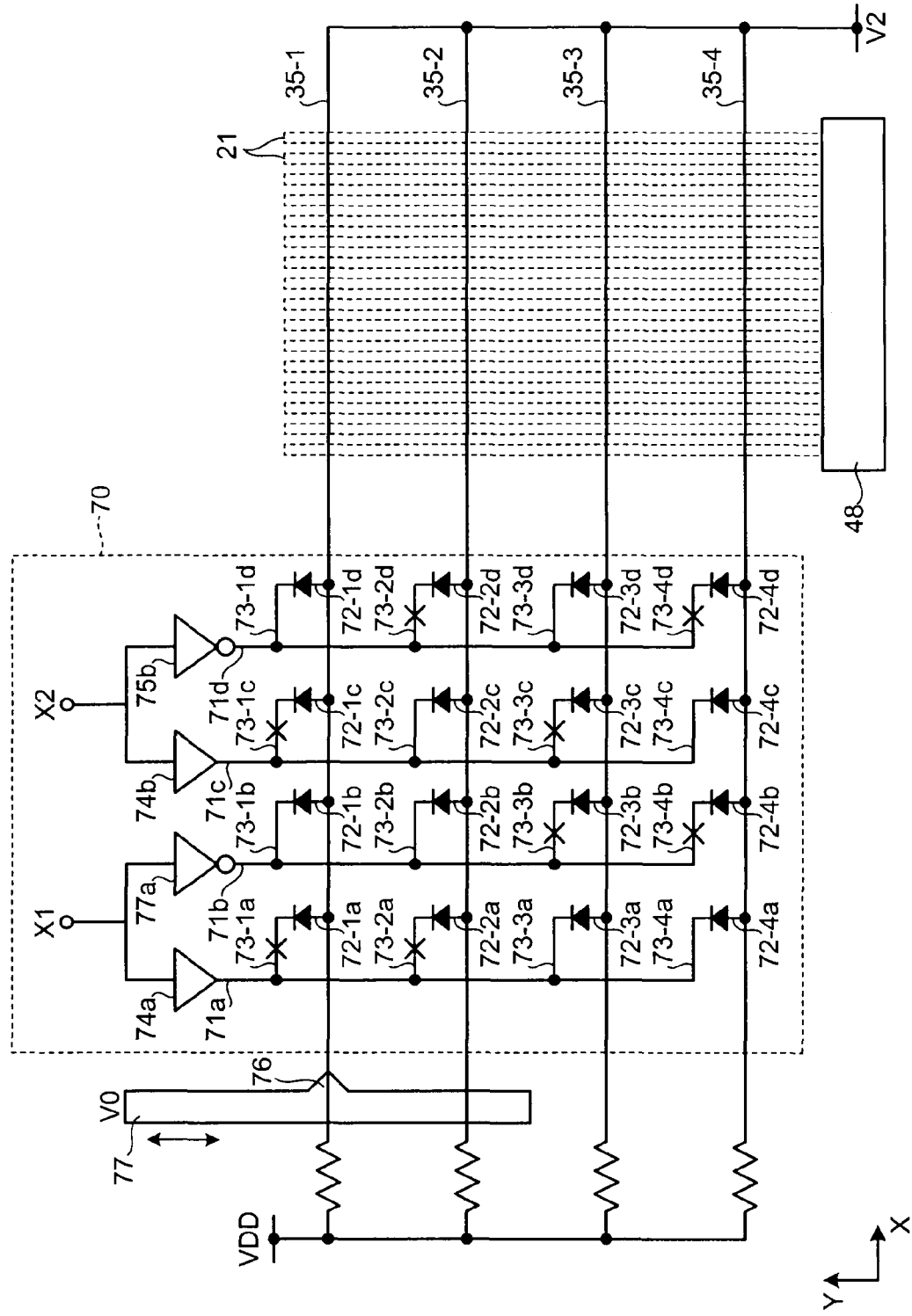

FIG.17

| WORD LINE No. | X1 | X2 |
|---|---|---|
| 35-1 | H | H |
| 35-2 | H | L |
| 35-3 | L | H |
| 35-4 | L | L |

NONVOLATILE STORAGE DEVICE AND METHOD OF MANUFACTURING THE SAME, AND STORAGE DEVICE AND METHOD OF MANUFACTURING THE SAME

CROSS-REFERENCE TO RELATED APPLICATIONS

This application is a division of and claims the benefit of priority under 35 U.S.C. §120 from U.S. Ser. No. 11/533,648 filed Sep. 20, 2006, and claims the benefit of priority under 35 U.S.C. §119 from Japanese Patent Application No. 2005-348230 filed Dec. 1, 2005, the entire contents of each of which are incorporated herein by reference.

BACKGROUND OF THE INVENTION

1. Field of the Invention

The present invention relates to a nonvolatile storage device and a method of manufacturing the same, and a storage device and a method of manufacturing the same.

2. Description of the Related Art

In a semiconductor nonvolatile memory joined the mainstream at present, size of the minimum processing line width capable of drawing by lithography (hereinafter, referred to as photolithography) using light or X-ray is one of factors restricting storage capacity. In the photolithography, there exists a limit in miniaturization of processing line width, and therefore, an increase of storage capacity with miniaturization cannot be expected in future. With respect to such photolithography, lithography technology using a self-organization pattern such as nanoimprint and a block copolymer has been proposed recently. The minimum processing line width can be small in such lithography, as compared with photolithography for use in manufacturing of a known semiconductor memory.

Furthermore, a probe memory which uses a probe (needle) using principle of a Scanning Probe Microscope (referred to as SPM) is conventionally proposed (for example, "The "millipede" project", [online], IBM, [retrieved on Jul. 21, 2005], Retrieved from the Internet, <URL: http://www.zurich.ibm.com/st/storage/millipede.html>, Michel Despont, Ute Drechsler, R. Yu, H. B. Pogge, and P. Vettiger, Journal of Microelectromechanical Systems, 13, 895(2004)., H. Pozidis, Member, W. Haberle, D. Wiesmann, U. Drechsler, M. Despont, T. R. Albrecht, and E. Eleftheriou, IEEE Transactions on Magnetics, 40, 2531(2004)., H. Jonathon mamin, Robert P. Ried, Bruce D. Terris, and Daniel Rugar, Proceedings of the IEEE, 87, 1014(1999).). The probe memory uses thousands of arm type devices so called a cantilever having a sharp nanoscale leading end like a probe of SPM and microscopic holes representing respective bits are made on a thin plastic film to constitute a memory in which a state where a hole is present represents "1" of 1 bit; a state where a hole is absent represents "0".

However, there is a problem in that nanoimprint, more particularly, patterning by the hot embossing method cannot be applied to semiconductor memories with the same structure as a conventional semiconductor memories, because size $\Delta x$ as the tolerance of a position deviation when performs superposition necessary for pattern positioning to form a pattern of the next process in response to a pattern formed in the former process is larger than the minimum processing dimension f.

For example, in manufacture of semiconductor nonvolatile memories, for example, a NAND type flash memory, high positioning accuracy lithography is required in connection between ends of memory cell columns coupled together in a NAND type and bit lines or source lines and between bit lines and a sense amplifier. Such connection is performed by vias. In a via forming process, contact holes are formed in electrode patterns and elements and in an insulation layer thereabove by etching, and electrode patterns are further formed thereabove after making plugs. Therefore, in lithography used in forming such patterns, deviation size $\Delta X$ in positioning needs to be smaller than the minimum processing dimension F. That is, when an ordinary large-scale integration (referred to as LSI) is manufactured, lithography in which positioning deviation $\Delta X$ is smaller than the minimum processing dimension F is required for connection between wiring made for memory cells and peripheral circuits such as a sense amplifier and an address decoder, but not required for the memory cell portion itself.

Furthermore, in probe memories, different from general semiconductor memories, there is a problem in that access speed of reading, writing, and erasing is slow because mechanical operation is involved and parallel access to reading, writing, and erasing cannot be performed. Further, parallel operation which simultaneously performs access to reading, writing, and erasing by arranging a plurality of probes (needles) like a probe memory disclosed in the above first document is proposed. However, there is a limit to the parallel operation because a driving mechanism becomes too minute and miniaturization of the probe is difficult, as compared with wiring in the semiconductor memory.

SUMMARY OF THE INVENTION

According to one aspect of the present invention, a nonvolatile storage device includes a plurality of bit lines arranged in a column direction on a substrate; a plurality of word lines arranged in a row direction on the substrate; a memory cell array having a plurality of memory cells each of which is arranged at each of intersections of the bit line and the word line, where a store state of each of the memory cells changes according to an electric signal relatively applied to the word line and the bit line; a word line selection unit having a needle relatively movable with respect to the substrate which comes into contact with one word line of the plurality of word lines, setting the word line in contact with the needle to a selection state; and a sense amplifier detecting through the bit line the store state of the memory cell to be connected to the word line which is set to the selection state by the word line selection unit.

According to another aspect of the present invention, a method of manufacturing a nonvolatile storage device which includes a plurality of bit lines arranged in a column direction on a substrate; a plurality of word lines arranged in a row direction on the substrate; a memory cell array having a plurality of memory cells each of which is arranged at each of intersections of the bit line and the word line, where a store state of each of the memory cells changes according to an electric signal relatively applied to the word line and the bit line; a word line selection unit having a needle relatively movable with respect to the substrate which comes into contact with one word line of the plurality of word lines, setting the word line in contact with the needle to a selection state; and a sense amplifier detecting through the bit line the store state of the memory cell to be connected to the word line which is set to the selection state by the word line selection unit, the method includes forming a conductive material film which becomes the word lines electrically connecting the memory cells of the same row on the substrate; forming a mask on the conductive material film for forming the word line by lithography in which the minimum processing dimension is smaller than that of photolithography; forming the word lines using the mask by removing at least the conductive material film within a region not being masked; and placing the needle movable in a direction perpendicular to an extending direction of the word lines, coming into contact with one of the plurality of the word lines.

According to still another aspect of the present invention, a method of manufacturing a storage device which includes a plurality of bit lines arranged in a column direction on a substrate; a plurality of word lines arranged in a row direction on the substrate; a memory cell array having a plurality of memory cells each of which is arranged at each of intersections of the bit line and the word line, where a store state of each of the memory cells changes according to an electric signal relatively applied to the word line and the bit line; a word line address decoder setting one word line of the word lines to a selection state; and a sense amplifier detecting through the bit line the store state of the memory cell to be connected to the word line which is set to the selection state by the word line address decoder, the method includes forming the memory cell array on the substrate; forming a programmable logic array which includes a decoding wiring arranged in parallel to a forming direction of the bit line other than a forming region of the memory cell array, and a fuse or an antifuse arranged at each of intersections of the decoding wiring and the word line; forming a conductive material film which becomes the word line on a region where the memory cell array and the programmable logic array are formed; forming a mask on the conductive material film for forming the word line by lithography in which the minimum processing dimension is smaller than that of photolithography; forming the word lines using the mask by removing at least the conductive material film within the region not being masked; and contacting a needle capable of applying a predetermined voltage selectively to the word lines sequentially, and applying a voltage pattern which is different from each word line to the decoding wiring, thereby performing a cutoff of the fuse or a short-circuit of the antifuse arranged at intersection of the programmable logic array.

BRIEF DESCRIPTION OF THE DRAWINGS

FIGS. 9A and 9B are explanatory views showing another example of a procedure of a method of detecting a position of a word line with which the needle contacts.

FIG. 16A is a plan view schematically showing a NAND type flash memory having PLA composed of antifuses;

FIG. 16B is a view showing an example a process for short-circuiting the antifuses;

FIG. 16C is a view showing a state where a continuity state of the antifuses is changed according to a program;

FIG. 17 is a chart showing an example of combination of address signals which input to input terminals X1 and X2 in order for short-circuiting a predetermined antifuse by putting a needle into contact with a word line.

DETAILED DESCRIPTION OF THE INVENTION

Best mode for carrying out a nonvolatile storage device and a method of manufacturing the same, and a storage device and a method of manufacturing the same according to the present invention will be described below with reference to the accompanying drawings. In addition, a NAND type flash memory will be exemplified below as a nonvolatile storage device, however the present invention is not limited to such embodiments. Furthermore, sectional views of the nonvolatile storage device are schematic ones and a relationship between layer thickness and width and proportion of thickness of each layer are different from actual ones.

Figure 1A:
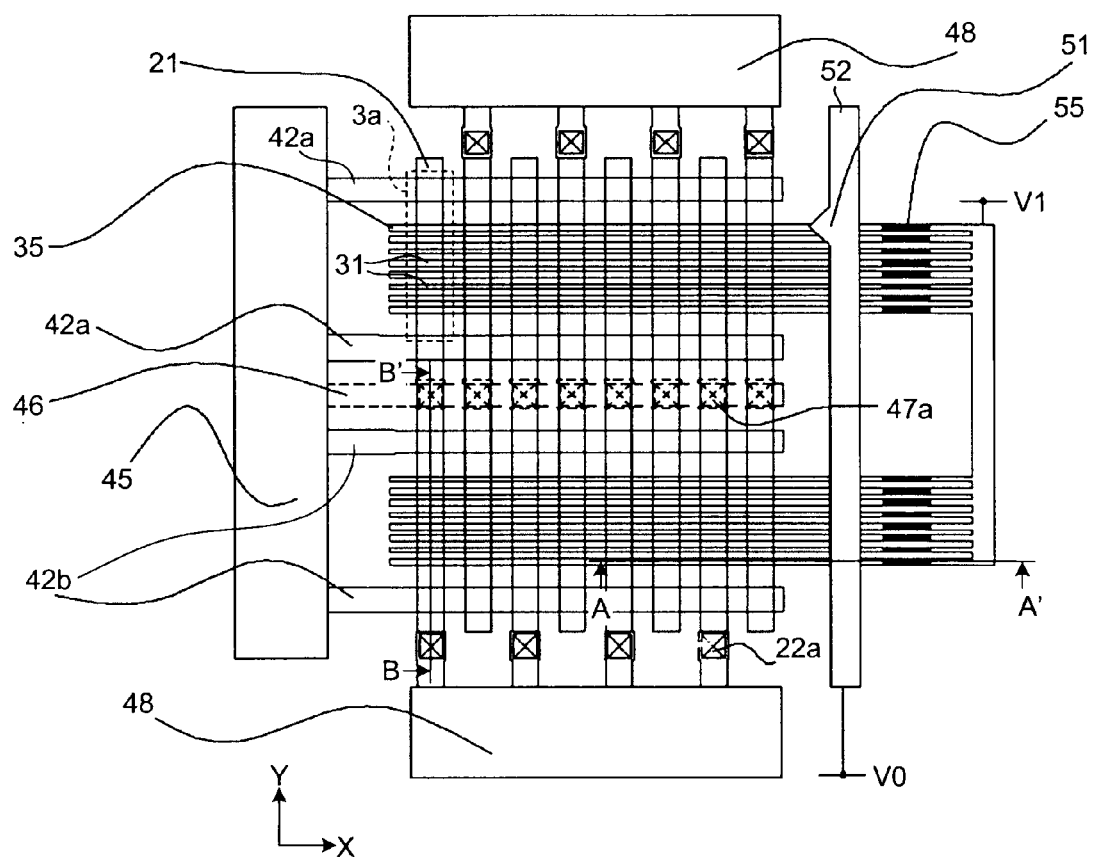
FIG. 1A is a plan view showing a NAND type flash memory as a nonvolatile storage device according to a first embodiment.
Figure 1B:
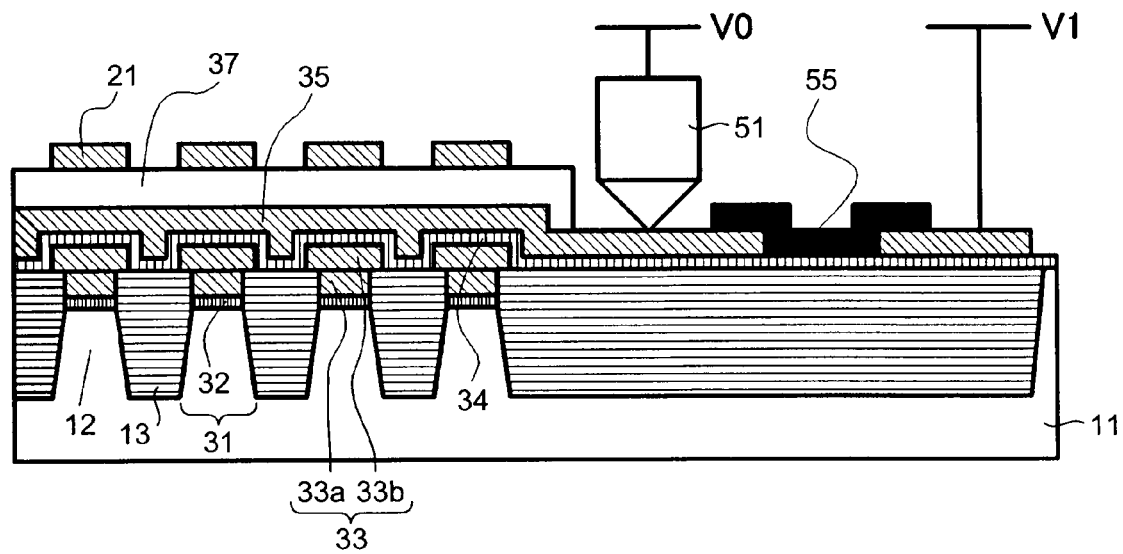
FIG. 1B is a sectional view seen from the line A-A' shown in FIG. 1A.
Figure 1C:
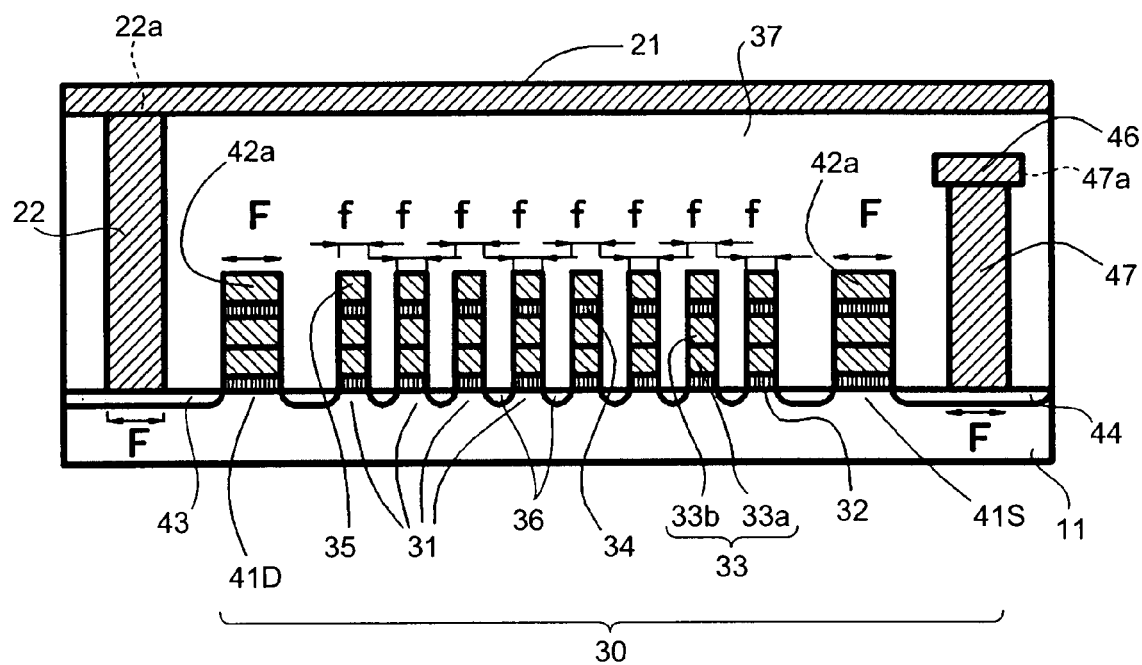
FIG. 1C is a sectional view seen from the line B-B' shown in FIG. 1A.

FIGS. 1A to 1C are views showing an example of configuration of a NAND type flash memory as a nonvolatile storage device according to a first embodiment. FIG. 1A is a plan view showing the NAND type flash memory, FIG. 1B is a sectional view seen from the line A-A' shown in FIG. 1A, and FIG. 1C is a sectional view seen from the line B-B' shown in FIG. 1A. In addition, in FIG. 1A, the horizontal direction of the page space is X-axis and a direction perpendicular to the X-axis is Y-axis.

The NAND type flash memory includes, on a semiconductor substrate (hereinafter, merely referred to as substrate) 11, a plurality of bit lines 21 parallel to each other extending in the Y-axis direction; a plurality of word lines 35 extending in a direction (X-axis direction), which are arranged to intersect with the bit lines 21 at a predetermined angle (generally substantially at a right angle); a plurality of memory cells 31, each of which being formed in response to near a point at the intersection of the bit line 21 and the word line 35; a plurality of selection gate control lines 42a and 42b formed parallel to the word lines 35 which are sectioned as a unit by a predetermined number of the word lines 35; a selection gate control circuit 45 which selects in the unit by which the word lines 35 are sectioned by a pair of the selection gate control lines 42a and 42b; a common source line 46 extending parallel to the word line 35; a sense amplifier 48 connected to the bit lines 21; and a needle 51 made of a MEMS (Micro Electro Mechanical Systems) probe which selects the word line 35.

The memory cell 31 is constituted by a memory transistor in which a gate insulating film 32, a floating gate (electric charge accumulation layer) 33, an between-gate insulating film 34, and a control gate (word line) 35 are formed in this order in an element forming region 12 on the substrate 11. A source/drain region 36 made of an n-type diffusion layer is formed in the substrate region which sandwiches an accumulation gate including the floating gate 33 and the control gate 35. In addition, in this example, the floating gate 33 is of double-layered structure which includes a first floating gate 33a made of silicon or the like formed before element isolation and a second floating gate 33b made of silicon or the like formed after the element isolation. Furthermore, as shown in FIG. 1C, a plurality of the memory cells 31 are connected in series in the column direction to form a NAND type cell unit 30 (the NAND type cell unit 30 corresponds to a memory cell unit in the scope of claims) so that the source/drain region 36 is shared between the adjacent memory transistors (the memory cells 31). In this memory transistor, $SiO_2/Si_3N_4/SiO_2$ film (hereinafter, referred to as ONO film) or the like can be used as the between-gate insulating film 34. Further, patterning of the control gates 35 of the memory transistor is performed so as to continue the plurality of memory cells 31 in the same rows of the memory cell array to become the word lines. In a NAND type flash memory, the NAND type cell unit 30 is arranged in an array to constitute a memory cell array.

Patterning of the bit line 21 is performed in the Y axis direction on an insulation layer 37 formed on the word lines 35, as shown in FIG. 1C. The bit line 21 is electrically connected to a drain region 43 of a selection transistor 41D at one end of the NAND type cell unit 30 through a via 22 formed in the insulation layer 37. In addition, the bit line 21 and the via 22 are connected by a bit line contact 22a. Furthermore, a source region 44 of a selection transistor 41S at the other end of the NAND type cell unit 30 is connected to the common source line 46 through a via 47 formed in the insulation layer 37. The common source line 46 and the via 47 are connected by a source line contact 47a. Line widths of the bit line 21 and the common source line 46 correspond to the minimum processing dimension F obtained by ordinary photolithography. In addition, the vias 22 and 47 shown here denote one in which electrode material is embedded in a via hole which is formed in the insulation layer connecting between a lower layer wiring or elements and an upper layer wiring, in a structure where the upper layer wiring is formed on the lower layer wiring or elements via the insulation layer.

The sense amplifier 48 amplifies voltage from the bit line 21 to read an accumulation state of an electric charge of each memory transistor and outputs it to a circuit in a later stage not shown in the drawing. More specifically, the sense amplifier 48 connected to the bit line 21 reads a state of the memory cell 31 on each of the bit lines 21 at the word line 35 selected by the needle 51 to be described later. The circuit in a later stage of the sense amplifier 48 constituted by the sense amplifier 48 and a complementary metal-oxide semiconductor (referred to as CMOS) is formed by lithography capable of positioning for superposition with the bit line 21, that is, photolithography because of being connected via wiring using vias. Therefore, line width is the minimum processing dimension F obtained by ordinary photolithography.

The word lines 35 are wiring for commonly connecting the control gates of the memory cells 31 in the same row and parallelly arranged in plural number in the direction (X-axis direction) substantially perpendicular to the NAND type cell unit 30. In the first embodiment, the semiconductor is formed using a mask by lithography having the minimum processing dimension f. It is noted that the minimum processing dimension f is smaller than the minimum processing dimension F of lithography in such as a nanoimprint, where a positioning accuracy of ordinary superposition is high but positioning accuracy $\Delta x$ is low. Therefore, the line width f of the word line 35 can be small, as compared with the line width (line width of the NAND type cell unit 30) F of the column direction and clearance f of the adjacent word line 35 can also be narrowed, thereby allowing downsizing in the Y axis direction. In this example shown in FIG. 1A, eight word lines 35 are arranged as one set and disposed between a pair of selection gate control lines 42 to be described later.

The selection gate control lines 42 are wiring connected to the selection gates of the selection transistors 41D and 41S disposed on both ends of the NAND type cell unit 30, arranged parallel to the word lines 35, and connected to the selection gate control circuit 45. In addition, in FIG. 1C, the selection transistors 41D and 41S also include the gate insulating film 32, floating gate 33, between-gate insulating film 34, and control gate 35, as same in the memory transistor. However, at a predetermined position not shown in the drawing, the floating gate 33 and the control gate 35 are short-circuited to become the selection gates. The selection gate control lines 42 are also required to be connected to the selection gate control circuit 45 to be described later and are formed by photolithography technology capable of positioning, which is the same as in the NAND type cell unit 30. Therefore, line width of the selection gate control line 42 is larger than that of the word line 35 and is the minimum processing dimension F in the photolithography.

The selection gate control circuit 45 has function which designates an access region when accessing to the NAND type flash memory. In FIG. 1A, a total of 2 sets composed of one set of eight word lines 35 sandwiched by a pair of the selection gate control lines 42a and one set of eight word lines 35 sandwiched by a pair of the selection gate control lines 42b are shown. However, a set of the word lines 35 sandwiched at both ends by the selection gate control lines 42 may be continuously arranged in not less than three sets in the Y axis direction or arranged in one set. In such a case, the selection gate control circuit 45 selects an access region by applying a predetermined voltage to a pair of the selection gate control lines 42a and 42b sandwiching the region.

The needle 51 is a mechanical driving type MEMS probe using the principle of scanning probe microscope (referred to as SPM) in an atomic force microscope or the like, and a leading end thereof has a structure thinner than the line width f of the word line 35. The needle 51 is supported by a supporting member 52 via a driving mechanism such as an actuator not shown in the drawing. Position resolutions of the needle 51 and the driving mechanism are designed smaller than $\Delta x$. The needle 51 is moved to a selected position of the word line 35 along the supporting member 52 in the direction perpendicular to the extending direction of the word line 35 (that is, the Y axis direction) by the driving mechanism made by MEMS. At this time, the driving mechanism is made by MEMS and therefore the needle 51 is accurately moved even when the line width and clearance of the word line 35 is in the unit of nanometer scale, thereby allowing to select a predetermined word line 35. When the needle 51 is moved to immediately above the predetermined (selected) word line 35 by the actuator, different voltage is applied according to whether a state is in writing to or reading from the word line 35 and addressing of the word line 35 is performed by putting it into contact with the word line 35. In addition, here, the driving mechanism is connected to the needle 51, however the supporting member 52 may be moved to the direction perpendicular to the extending direction of the word line 35 by fixing the needle 51 to the supporting member 52 and connecting the driving mechanism to the supporting member 52. Furthermore, it may be configured that a side of the substrate 11 is connected to the needle driving mechanism to drive and the needle 51 is fixed to a package of the nonvolatile memory or the like to relatively move with respect to the substrate 11. The needle 51, supporting member 52, and the driving mechanism correspond to a word line selection unit in the scope of the claims.

By the way, in a ordinary nonvolatile semiconductor storage device, the word lines 35 are connected to a word line address decoder, this is because that both can be accurately positioned and connected using a ordinary semiconductor manufacturing process with photolithography. However, in this first embodiment, the word line 35 is formed by lithography which has not positioning accuracy of superposition, and therefore the word line address decoder cannot be connected to the word line 35. Therefore, in place of the word line address decoder which is a unit for selecting the word lines 35, the needle 51 is provided.

In addition, one end of the word lines 35 is connected to a power source of voltage V1 and high resistance thin film layers 55 are provided between the power source above the word lines 35 and positions in contact with the needle 51. The high resistance thin film layers 55 has function by which voltage of the word line 35 in which the needle 51 comes into contact with reduces to 0 V by a voltage drop when reading, writing, and the like.

Figure 2:
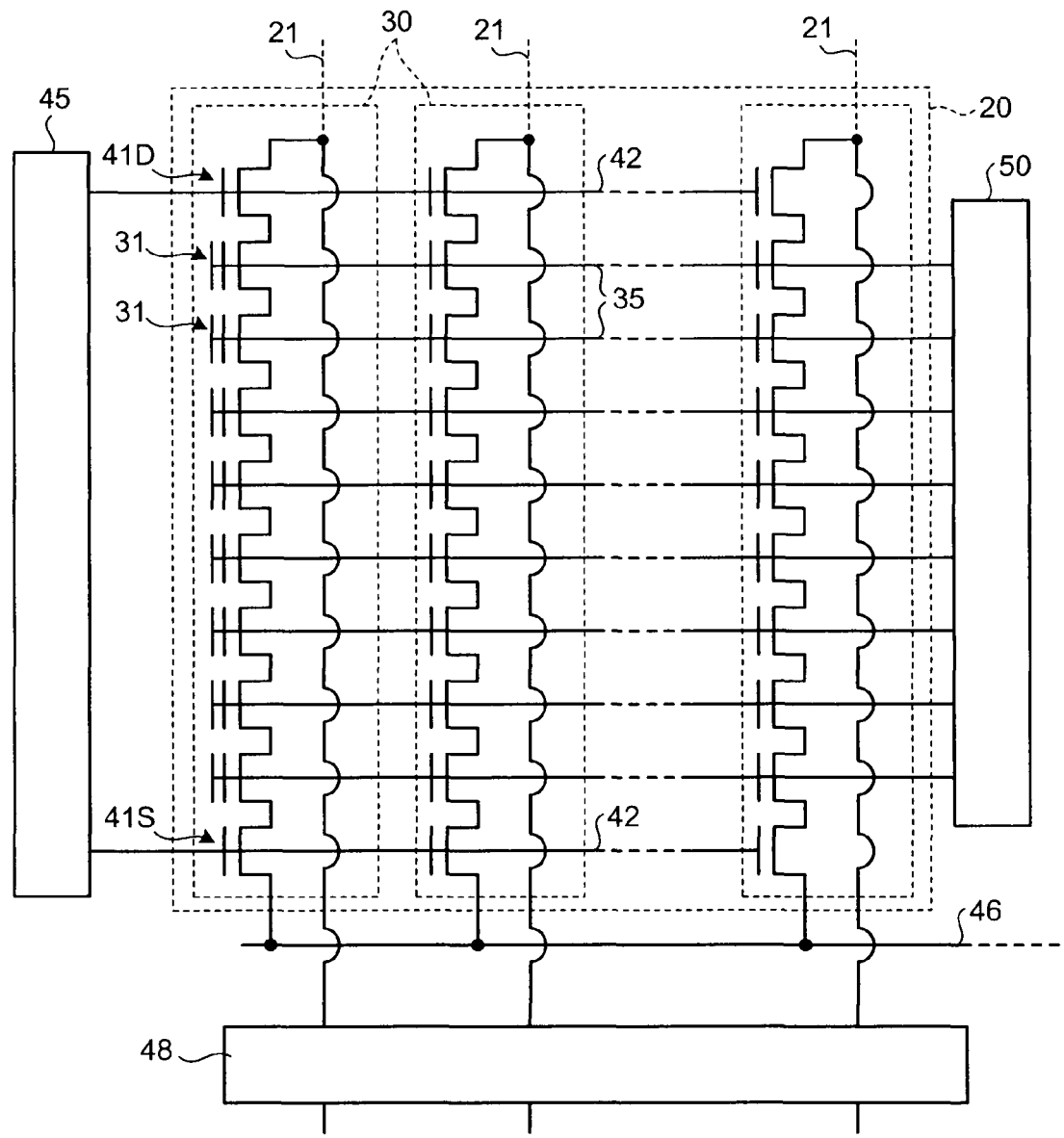
FIG. 2 is an equivalent circuit diagram of the nonvolatile semiconductor storage device shown in FIGS. 1A to 1C.

FIG. 2 is an equivalent circuit view of the nonvolatile semiconductor storage device shown in FIGS. 1A to 1C. The memory cell array 20 is composed of electrically rewritable nonvolatile memory transistors (the memory cells 31) arranged in an array of a plurality of rows and columns. Here, a plurality of memory cells 31 is connected in series in the extending direction of the bit line 21 to constitute the NAND type cell unit 30. One end of the NAND type cell unit 30 is connected to the bit line 21 via the selection transistor 41D and the other end is connected to the common source line 46 via the selection transistor 41S. Furthermore, the control gate of each of the memory cells 31 in the NAND type cell unit 30 is connected to a different word line 35, and each of the gates of the selection transistors 41D and 41S is respectively connected to the selection gate control line 42 parallel to the word lines 35. The selection transistors 41D and 41S are arranged to select an access memory cell 31 and prevent from improperly reading and writing. One end of the bit lines 21 are connected to the sense amplifier 48 and one ends of the word lines 35 are connected to a word line address decoder 50. The word line address decoder 50 is supported by the supporting member 52 shown in FIG. 1A and corresponds to the needle 51 movable by the driving mechanism. Furthermore, the selection gate control circuit 45 is connected to the selection gate control line 42.

Figure 3A:
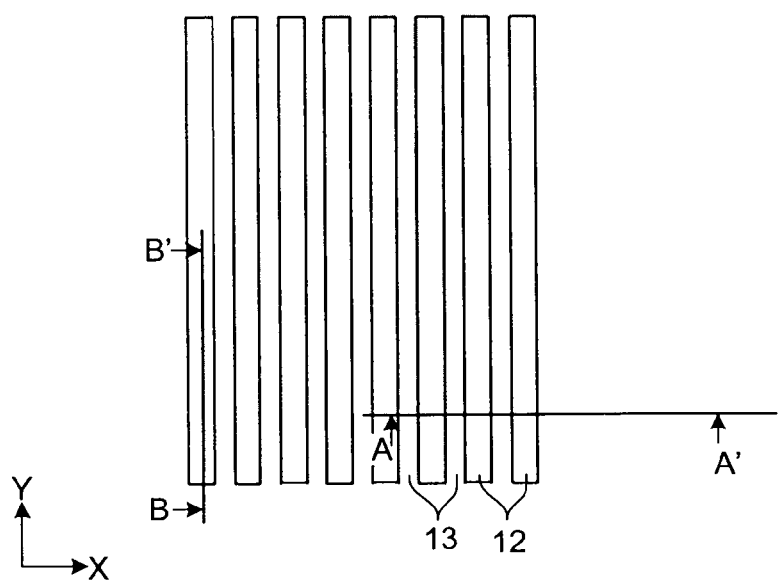
FIGS. 3A and 3B are plan views showing an example of a procedure of a manufacturing method of the NAND type flash memory.
Figure 3B:
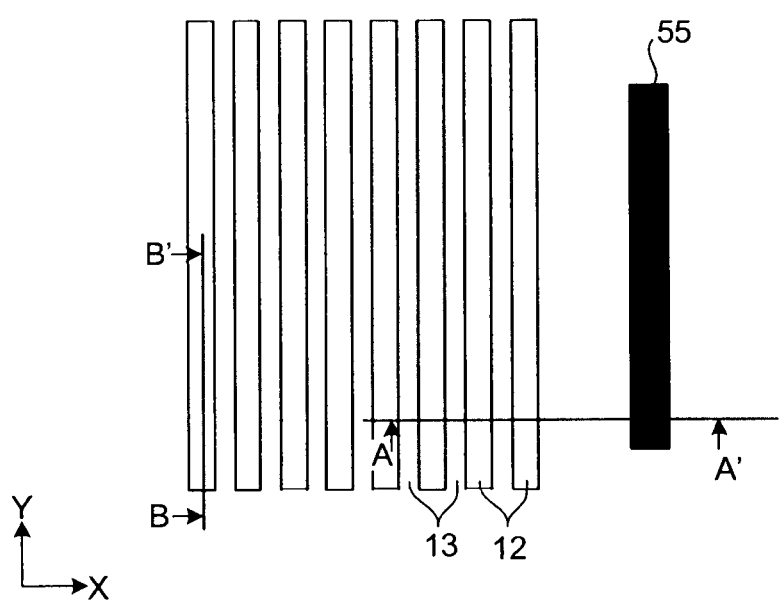

Now, an example of a manufacturing method of the NAND type flash memory of the first embodiment will be described. FIGS. 3A to 5D are views showing an example of a procedure of the manufacturing method of the NAND type flash memory. More specifically, FIGS. 3A and 3B are plan views showing the example of the procedure of the manufacturing method of the NAND type flash memory, FIGS. 4A to 4G are sectional views showing the example of the procedure of the manufacturing method, seen from the line A-A' shown in FIGS. 3A and 3B, and FIGS. 5A to 5D are sectional views showing the example of the procedure of the manufacturing method, seen from the line B-B' shown in FIGS. 3A and 3B.

Figure 4A:
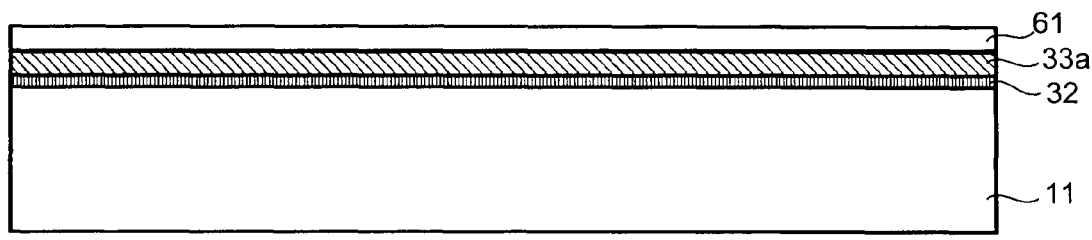
FIGS. 4A to 4G are sectional views showing an example of a procedure of a manufacturing method, seen from the line A-A' shown in FIGS. 3A and 3B.

First, an impurity dopant of a predetermined conductivity type is diffused into the surface of the substrate 11 such as a silicon single-crystal substrate using the ion injection method or the like to form a well in a memory cell array region for forming a memory cell array. Here, a p-type impurity dopant is diffused to form a p-type well. After that, as shown in FIG. 4A, the gate insulating film (tunnel insulating film) 32 is formed in a memory cell array region on the surface of the substrate 11 by oxidizing the surface of the substrate 11 by the thermal oxidation method. Subsequently, the first floating gate 33a made of a polysilicon film is formed and a masking member 61 made of a silicon oxide film and a silicon nitride film is further formed. The first floating gate 33a and the masking member 61 are formed by a film deposition method such as the chemical vapor deposition method (referred to as CVD).

Figure 4B:
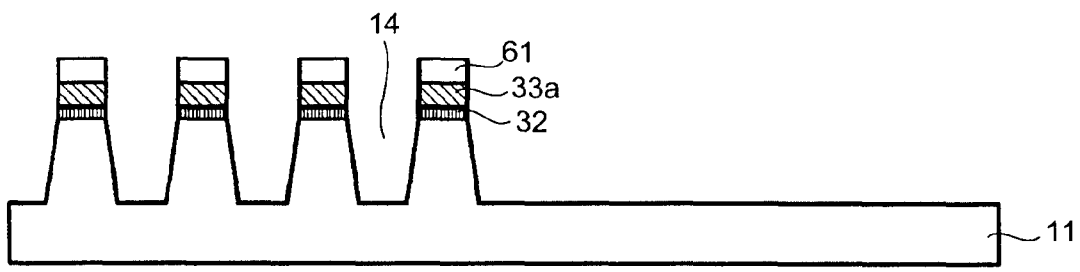

Next, as shown in FIG. 4B, a trench 14 is formed in a forming direction (Y axis direction) of the bit line 21 for element isolation so called shallow trench isolation (referred to as STI). More specifically, a resist is applied on the substrate 11 to perform patterning by ordinary photolithography such as ArF laser and $F_2$ laser and the resist at a position of the trench 14 formed parallel to the forming direction of the bit line 21 is removed. After that, the resist remaining after patterning is used as a mask to etch the masking member 61, the first floating gate 33a, the gate insulating film 32, and the substrate 11 so as to reach the inside of the substrate 11 by the reactive ion etching (referred to as RIE) method and thereby the trench 14 is formed.

Figure 4C:
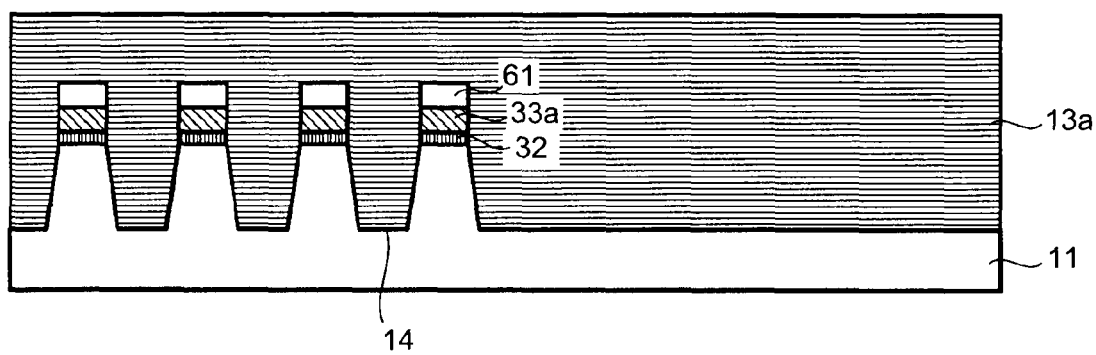
Figure 4D:
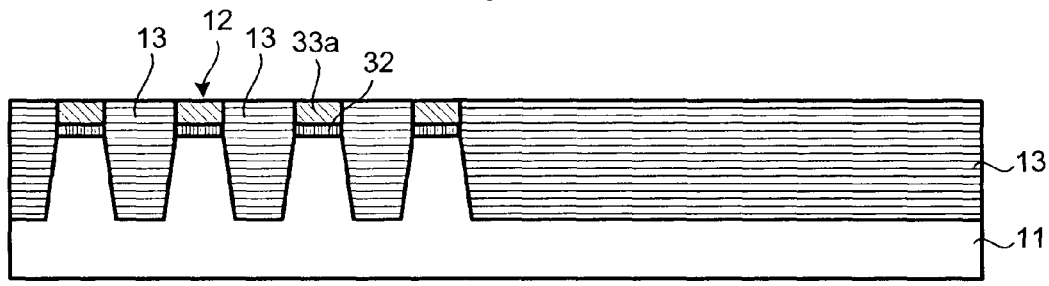

Then, as shown in FIG. 4C, an insulating film 13a is deposited by CVD or the like on the substrate 11 and it thereby becomes a state where the insulating film 13a is embedded in the trench 14. After that, as shown in FIG. 4D, polishing by the chemical mechanical polishing (referred to as CMP) method is performed until the surface of the masking member 61 is exposed in a region except at the trenches 14 and the masking member 61 is further removed, that is, until the first floating gate 33a is exposed. Thereby, an element isolation insulating film 13 is formed in the trench 14 and a region on the substrate 11, sandwiched between the element isolation insulating films 13 becomes the element forming region 12 in which the NAND type memory cell 31 is formed. In addition, in photolithography for forming the bit line 21 or the like described in the first embodiment, at a position and accuracy of superposition, value of approximately three times as large as the standard deviation of the amount of deviation satisfies the condition which is larger than a half of the minimum processing line width of lithography.

Figure 4E:
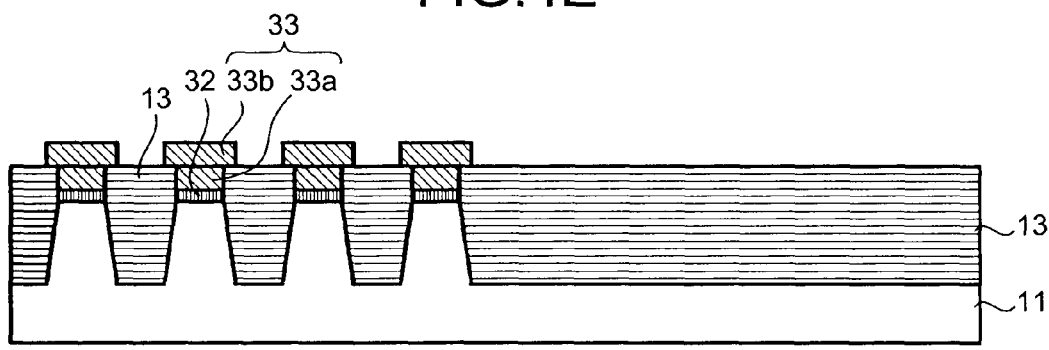

Next, a polysilicon film which is the second floating gate 33b is formed on the entire surface of the substrate 11 by the CVD method or the like and a resist is applied thereon. After a resist pattern having an opening on the element isolation insulating film 13 is formed by ordinary photolithography of the minimum processing dimension F, the resist pattern is used as a mask to etch the second floating gate 33b until the element isolation insulating film 13 is exposed by the RIE and the resist is removed. Thereby, as shown in FIG. 4E, the second floating gates 33b formed on the adjacent element forming regions 12 by slits formed on the element isolation insulating films 13 are isolated.

Figure 4F:
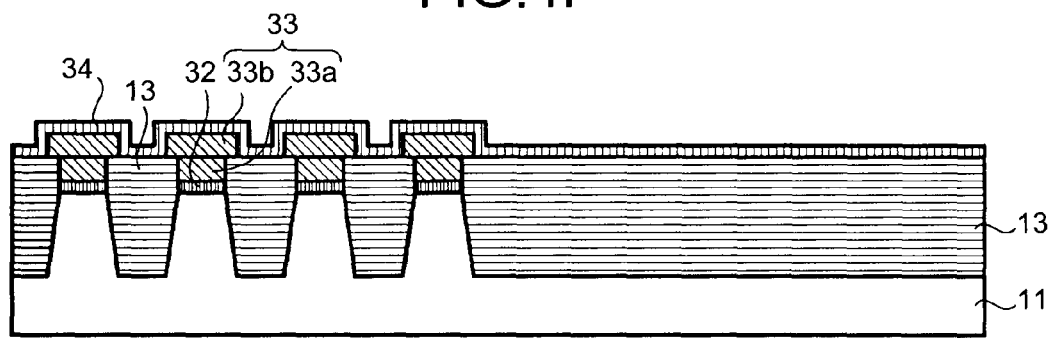
Figure 4G:
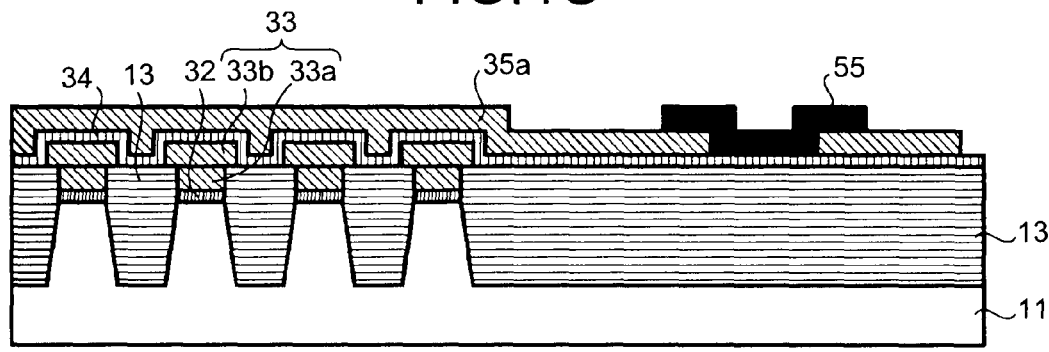

Then, as shown in FIG. 4F, the between-gate insulating film 34 made of an ONO film is formed by the CVD method or the like. After that, a conductive material film 35a, which is the word line (control gate), is formed by the CVD method or the like. Then, as shown in FIG. 4G, a high resistance polysilicon film is deposited so as to cover a portion where the conductive material film 35a is removed at a predetermined position and etching is performed so that the high resistance polysilicon film is remained only at a region which comes into contact with the needle 51 and a region sandwiched by the power source to form high resistance thin film layer 55 at a region where the conductive material film 35a is removed.

Figure 5A:
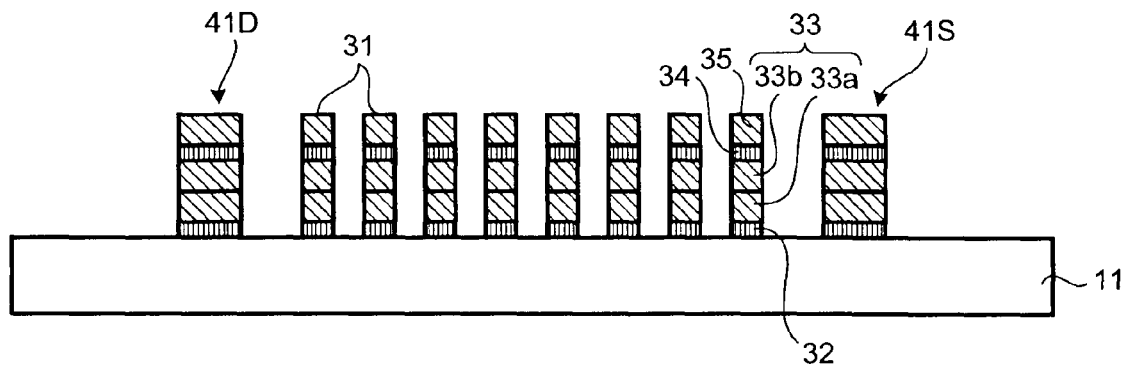
FIGS. 5A to 5D are sectional views showing an example of a procedure of a manufacturing method, seen from the line B-B' shown in FIGS. 3A and 3B.

Next, as shown in FIG. 5A, the word lines 35 are formed in a direction substantially perpendicular to the element forming regions 12 by nanoimprint such as the hot embossing method or the like. More specifically, a resist is applied on the conductive material film 35a and heated to a predetermined temperature to soften the resist. After that, a molding processed in a shape of the word line is put into contact with the resist to press so that shape of the word lines are substantially perpendicular to the element forming regions 12, and after the resist is deformed, the resist is cooled to be solidified. Then, a thin resist at a concaved portion on the resist is removed to expose the surface of the conductive material film 35a and the resist remaining is used as a mask to etch until the surface of the substrate 11 is exposed by the RIE method or the like. Thereby, the word lines 35 are formed in a direction substantially perpendicular to the element forming regions 12.

Here, as shown in FIG. 5A, the gate insulating film 32, the first and second floating gates 33 (33a and 33b), the between-gate insulating film 34, and the conductive material film 35a disposed at a region where the word line 35 is not formed are removed by etching. After that the resist is removed to form the word line 35. In addition, as for processing of the word line 35, lithography technology in which the minimum processing dimension is smaller than ordinary photolithography is used and electron beam exposure and a block copolymer can be also used other than the nanoimprint. Furthermore, the nanoimprint exemplified here is not high in positioning accuracy of superposition and therefore it cannot be connected through the via to the sense amplifier, circuit disposed in a later stage, and the like, as in the case where the word line is formed by ordinary photolithography.

In addition, at this time, the selection gate control lines 42 connected to the gates of the selection transistors 41 outside the both ends of the word lines 35 arranged in the Y axis direction are simultaneously formed at the process for forming the word lines 35. In this regard, however, the selection gate control line 42 is connected to a CMOS circuit which is a logic circuit at a later stage, and therefore the selection gate control line 42 has line width approximately the minimum processing dimension F of ordinary photolithography.

Figure 5B:
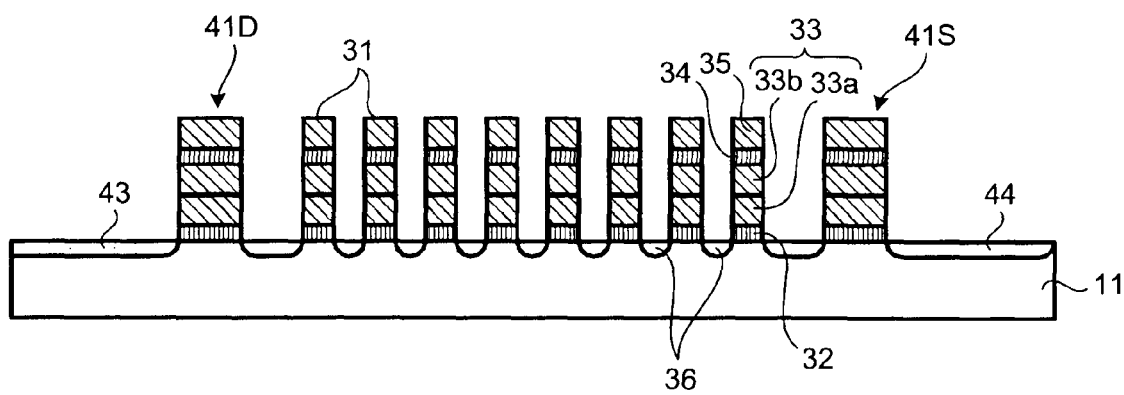

After that, as shown in FIG. 5B, the word line 35 formed by the aforementioned process is used as a mask to perform ion injection on the substrate 11 and a diffusion layer is formed between the word lines 35. More specifically, the diffusion layer is formed at a region on the substrate 11 sandwiching the word line 35 to form the source/drain region 36. In the case of NAND type flash memory, the memory transistors (memory cells 31) are arranged in series and therefore a drain region 36 of a certain word line 35 which intersects on one element forming region 12 is shared as a source region 36 of another adjacent word line 35. In addition, here, an n-type impurity is doped by ion injection.

Figure 5C:
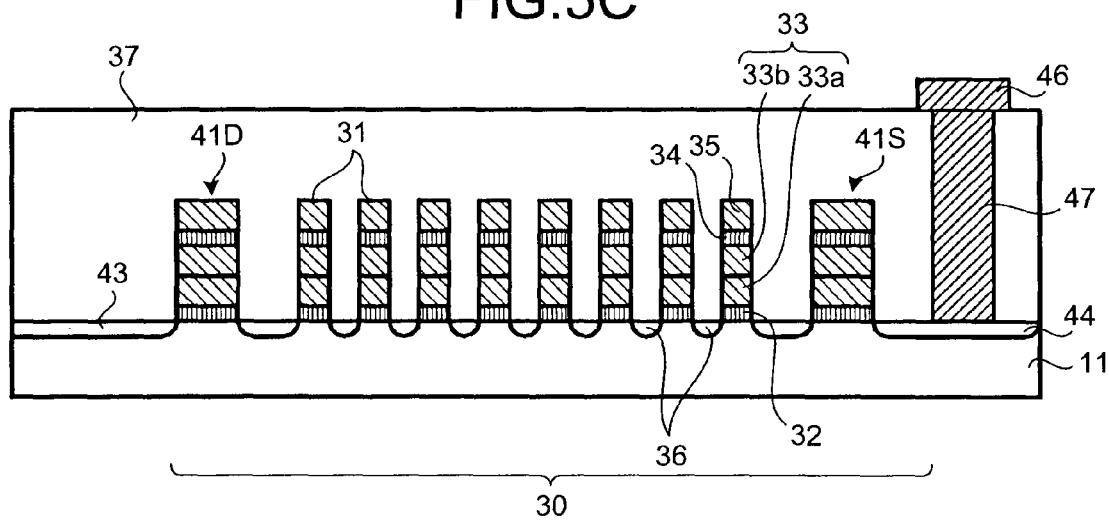

After that, as shown in FIG. 5C, connection is made at an end of the NAND type cell unit 30 column with the common source line 46 and therefore the insulation layer 37 is formed on the entire surface of the substrate 11 in which the word lines 35 are formed. A via hole is formed in the insulation layer 37 so as to be connected to the source region 44 of the selection transistor 41S of one end of the NAND type cell unit 30, and electrode material is embedded in the via hole to form the via 47. Then, the common source line 46 is formed so as to be connected to the via 47 which is connected to the source region 44 of the selection transistor 41S of one end of the NAND type cell unit 30 formed in the insulation layer 37.

Figure 5D:
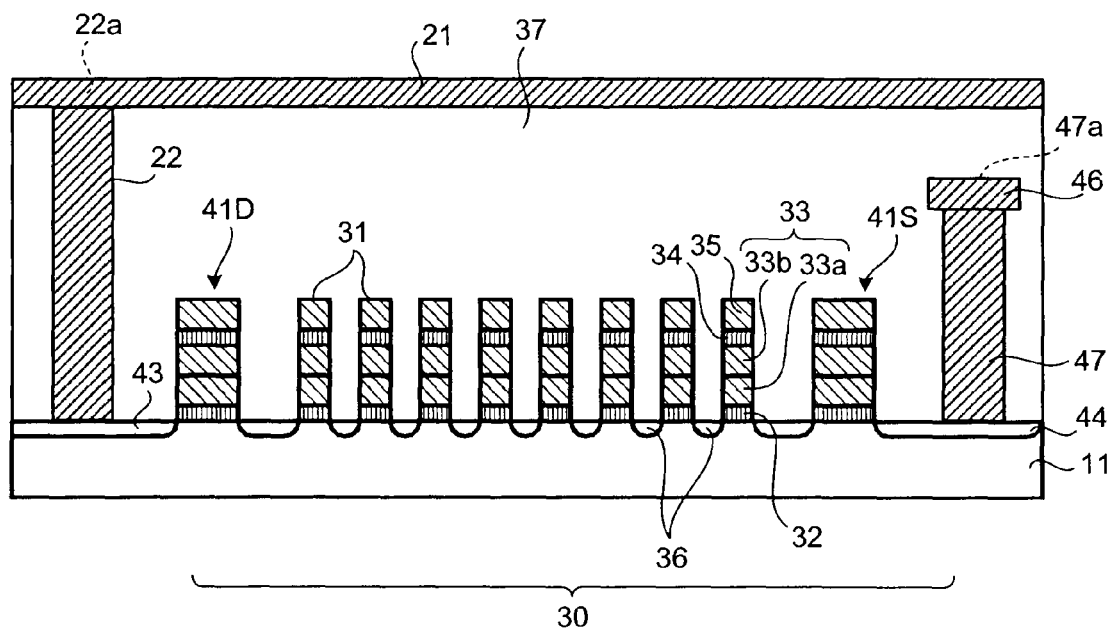

Furthermore, the insulation layer 37 is further deposited on the insulation layer in which the common source line 46 is formed and a via hole to be connected to the drain region 44 of the selection transistor 41D of one end of the NAND type cell unit 30 is formed in the insulation layer 37. Then, as shown in FIG. 5D, electrode material is embedded in the via hole to form the via 22 and the bit lines 21 extending in the Y axis direction is formed on the insulation layer 37 so as to be connected to the via 22.

Each of the selection gate control lines 42a and 42b is connected to the selection gate control circuit 45, as shown in FIG. 1A. Furthermore, a sense amplifier 48 is formed in an extension of the element forming region 12. Then, the needle 51 for selecting the word line 35 is placed at a predetermined position so as to be able to come into contact with the word line 35, whereby the NAND type flash memory shown in FIGS. 1A to 1C can be manufactured.

Figure 6:
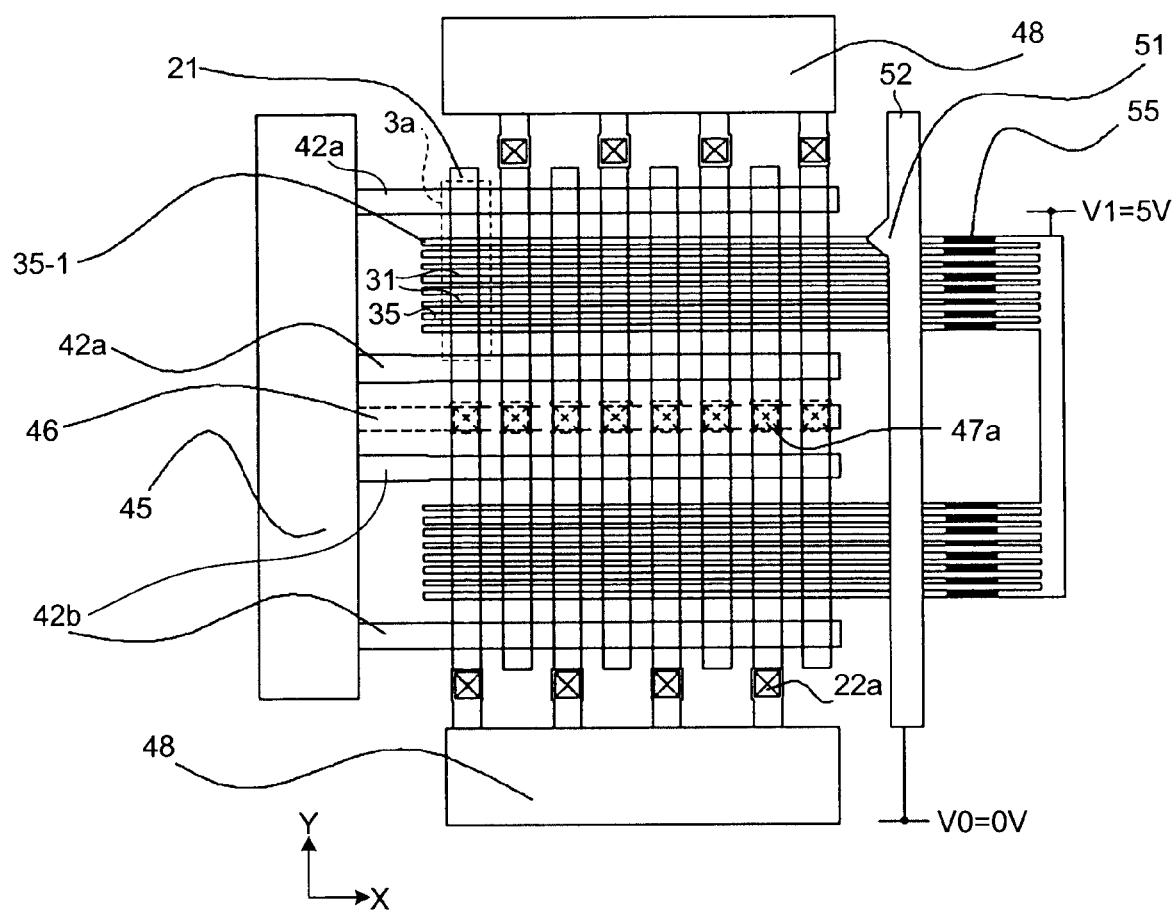
FIG. 6 is a view schematically showing a state of reading data from the NAND type flash memory.

Next, operation of such configured NAND type flash memory will be described. FIG. 6 is a view schematically showing a state of data reading in the NAND type flash memory. Data reading from the NAND type flash memory is performed by detecting whether current flows from the drain to the source when the memory cell 31 is in an ON state at a predetermined control gate voltage or the current does not flow when the memory cell 31 is in an OFF state, by amplifying by the sense amplifier 48. For example, the power source sets a voltage V1 which is supplied to the word line 35 to 5V, and a voltage V0 of the needle 51 to 0V. Thereby, a voltage of 5V is applied to the control gate of the memory cell 31, which is in a state where the needle 51 does not select the word line 35, to be in an ON state. At this time, a voltage of 5V is applied to the bit line 21 and a voltage of 0V is applied to the common source line 46.

Then, a leading end of the needle 51 is driven to a certain position of the word line 35-1 by a driving mechanism not shown in the drawing, and after reaching the position of the word line 35-1, the needle 51 is put into contact with the word line 35-1. A voltage of the word line 35-1 in contact with the needle 51 becomes 0V due to a voltage drop at the high resistance thin film layer 55. A voltage of the word line 35 other than the word line 35-1 is 5V as aforementioned. That is, it becomes a state where the word line 35-1, whose voltage is 0V, is selected. In this state, a current flowing in the bit line 21 is amplified by the sense amplifier 48 to be detected, whereby the presence or absence of an electric charge at the floating gate 33 of the memory cell 31 beneath the same word line 35-1 can be detected. As in the known NAND type flash memory, a memory cell just beneath the same word line 35-1 to be connected to a different bit line can be simultaneously read in parallel and therefore reading rate converted per 1 bit is high. After that, other word lines 35 are similarly put into contact with the needle 51 to repeatedly implement the process for detecting an electric charge state of the respective memory cells 31 by the sense amplifier 48, and read process of the NAND type flash memory is performed.

Data erase (block batch erase) in the NAND type flash memory is performed by setting a voltage of a p-type well in a memory cell region to be 20V and a substrate potential to be 20V in a state where the voltage V1 is set to 0V, the voltage V0 of the needle 51 is set to 0V, voltage of all the word lines is set to 0V, voltage of the selection gate lines 42a and 42b is set to 20V by operating the selection gate line control circuit 45, and further all the bit lines 21 are open so that the common source line 46 is open. Thereby, threshold voltage $V_{th}$ of the entire memory cell in the block can be negative.

Data write in a general NAND type flash memory is performed to the selected memory cell 31 by supplying a voltage of 0V to the bit line 21 to be connected to the selected memory cell 31 and a voltage of 7V to other bit lines, by supplying a voltage of 20V to a gate of the selection transistor on the bit line contact 22a side, by supplying a voltage of 0V to a gate of the selection transistor on the source line contact 47a side, and by supplying a voltage of 20V to the word line 35-1 to be connected to the memory cell 31 and a voltage of 7V to non-selected word lines 35. Furthermore, Data write in the NAND type flash memory using the needle 51 of the first embodiment, first, the needle 51 is moved so that the needle 51 comes into contact with a word line 35 to be connected to the memory cell 31 in which writing is performed by setting V1 and V0 to 0V. After that, a voltage of 20V can be supplied to the word line 35-1 to be connected to memory cell 31 and a voltage of 7V can be supplied to the non-selected word lines 35 by applying a voltage of 7V to V1 and 20V to V0. As a result, threshold voltage $V_{th}$ of the memory cell can be positive.

In this manner, since the word line is configured so as to be selected by the needle 51, operation can be available without using the word line address decoder even in the case of a nonvolatile storage device having the word line 35 formed by using nanoimprint, whose positioning accuracy of superposition is not high, as lithography.

As described above, in the first embodiment, it is characterized in that ordinary lithography (the minimum processing dimension F) with a high positioning accuracy is used for wiring (the bit lines 21) to one direction to be coupled to the memory cell 31, and lithography, in which the minimum processing dimension f is smaller than the minimum processing dimension F of ordinary lithography with high positioning accuracy though positioning accuracy is low like nanoimprint, is used for wiring (the word lines 35) to a direction substantially perpendicular to the bit lines. Thereby, a size of the memory cell can be reduced. However, lithography of the minimum processing dimension f causes bad positioning accuracy and positioning deviation Δx cannot be reduced not more than f and therefore connection to wiring of a peripheral circuit such as an address decoder of the word line 35 through vias disposed with a spacing of approximate 2f cannot be performed. In this regard, however, as for wiring arranged apart with a spacing of not less than approximate 2F, if a large pattern electrode not less than approximate F is formed previously for via connection by lithography of the minimum processing dimension f, it is possible to connect through the via by forming a peripheral circuit using ordinary lithography with high positioning accuracy in which the minimum processing dimension is F (>f) in the subsequent process.

According to the first embodiment, although positioning accuracy of superposition is not high, the nonvolatile storage device can be manufactured without using address decoder even if the word line 35 formed using nanoimprint in which the minimum processing dimension is smaller than those obtained by ordinary photolithography technology as lithography is used. In this case, processing line width of the word line 35 can be small and a distance between the word lines 35 can be narrowed and therefore dimension in arrangement direction of the word lines 35 can be also reduced, there is an advantage in that element size in the case when storage capacity is the same size can be reduced (storage capacity is increased), as compared with the case when the processing line width is processed using known photolithography. Furthermore, since the word line is selected by one needle in which position resolution is smaller than Δx, addressing can be readily performed without using the address decoder even in the word line formed by lithography technology in which positioning accuracy of superposition is lower than photolithography.

Furthermore, since one needle 51 is used at the same time in one substrate 11, a complicated driving mechanism necessary for the case when a plurality of the needles are simultaneously put into contact with is not required. Further, there is an advantage in that speed of reading, writing, and erasing can be increased even where the needle is single, because the bit lines 21 are connected to the sense amplifier 48 by the same known photolithography and electric signals of a plurality of bit lines are simultaneously read as in the known NAND type flash memory.

Figure 7:
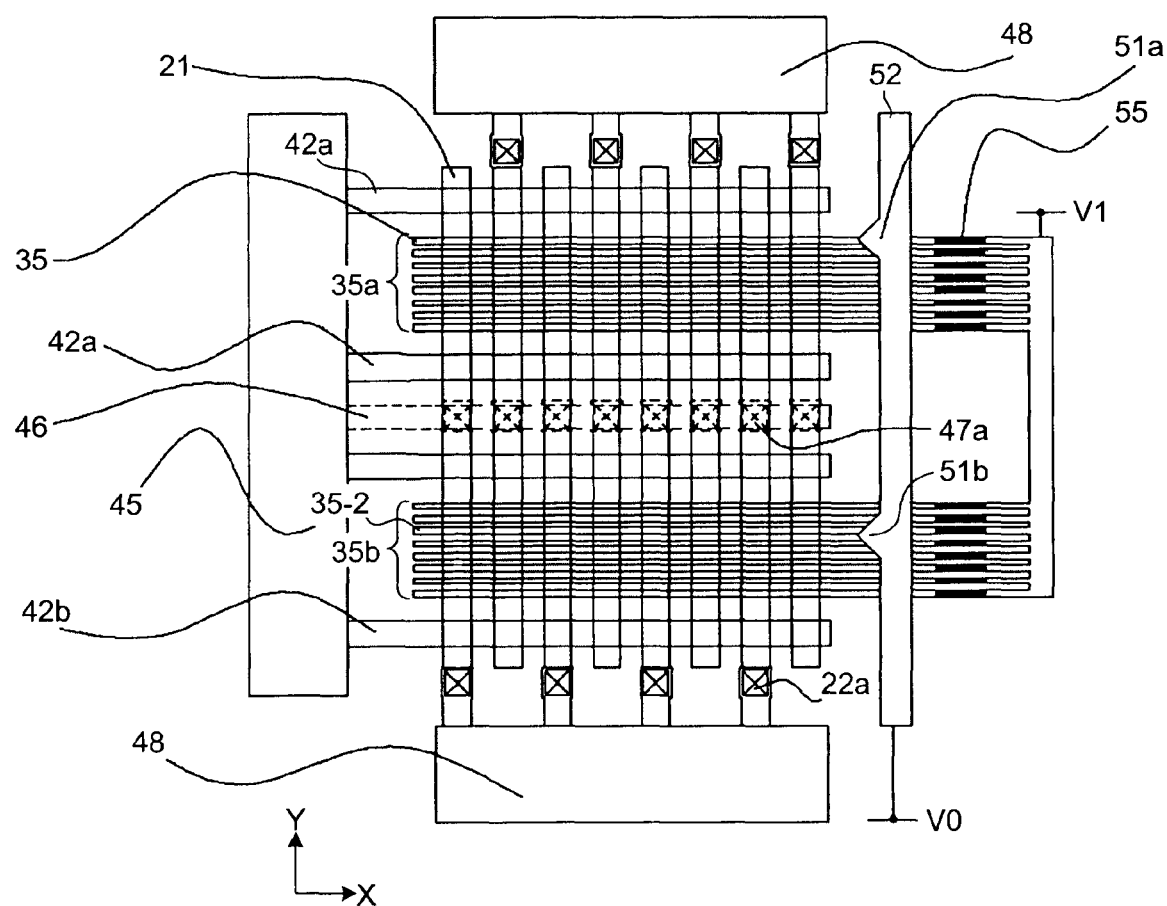
FIG. 7 is a plan view showing a configuration example of a NAND type flash memory as a nonvolatile storage device according to a second embodiment.

FIG. 7 is a plan view showing a configuration example of a NAND type flash memory as a nonvolatile storage device according to a second embodiment. The NAND type flash memory is the NAND type flash memory shown in FIG. 1A and it is characterized in that a plurality of needles 51a and 51b are provided with respect to one substrate. FIG. 7 shows the case where two needles 51a and 51b are supported by the supporting member 52. In such needles 51a and 51b, a plurality of the needles 51a and 51b which are selectively changeable in their distance with the substrate are disposed in the parallel direction to the word lines 35 so as to be put into contact with the word line 35. Thereby, moving distance (stroke) when the needles 51a and 51b move to a position of an object word line 35 can be reduced. Furthermore, when one needles 51a (or 51b) comes into contact with the word line 35, the other needle 51b (or 51a) which is expected not to come into contact with the word line 35 is in a state (retracted state) where a distance with respect to the substrate becomes large, whereby fault operation can be prevented. That is, the needle 51a (or 51b) which comes into contact with a certain word line 35 moves so as to lower toward the word lines 35 and the other needle 51b (or 51a) moves so as to apart from the word lines 35. In addition, this is one example, a plurality of the needles 51 may be fixed to the supporting member 52 so as that whole supporting member 52 moves. In this case, a plurality of the needles 51 come into contact with the word lines 35 simultaneously, however, voltage is applied (or grounded) only to one needle 51 and other needles 51 may be in a state either at different potential level by switching or floated (electrically floated) level. In addition, the same reference numerals are given to the same constitutional elements as the first embodiment and their repeated description will be omitted.

Next, one operational example of the needles 51a and 51b in such configured NAND type flash memory will be described. First, movable ranges of respective needles 51a and 51b are previously set. For example, in FIG. 7, the first needle 51a takes a movable range where eight word lines 35a are disposed between a pair of selection gate control lines 42a, and the second needle 51b takes a movable range where eight word lines 35b are disposed between a pair of selection gate control lines 42b. Then, a driving mechanism, for example, as for a position of a word line 35 that is expected to be read, obtains which movable range of needle 51a or 51b belongs to the position of the word line 35 and selects the needle 51 in charge of its movable range. For example, in the case where a word line 35-2 shown in FIG. 7 is expected to be read, the word line 35-2 is one of word lines 35*b* and therefore the second needle 51*b* is selected. Then, the second needle 51*b* is moved to the position of the object word line 35-2 to be put into contact with the word line 35-2. When the second needle 51*b* is put into contact with the word line 35-2, it is set to a retracted state so that the other needle (the first needle 51*a*) does not come into contact with the other word line 35. In addition, since operation of reading, erasing, and writing of the NAND type flash memory, which is performed by putting the word line 35 into contact with, is the same as the first embodiment, their description will not be repeated.

According to the second embodiment, a plurality of the needles 51 are provided for one substrate and therefore there is an advantage in that the moving distance to the object word line 35 can be shortened and operation process of reading, erasing, and writing can be performed faster, as compared with the case where the needle 51 is one.

In the configuration of the aforementioned NAND type flash memory, there exists a case that needs control for which position detection is performed which word line 35 comes into contact with the needle 51. Consequently, a NAND type flash memory having configuration in which position detection can be performed which word line 35 comes into contact with the needle 51 will be described below.

Figure 8:
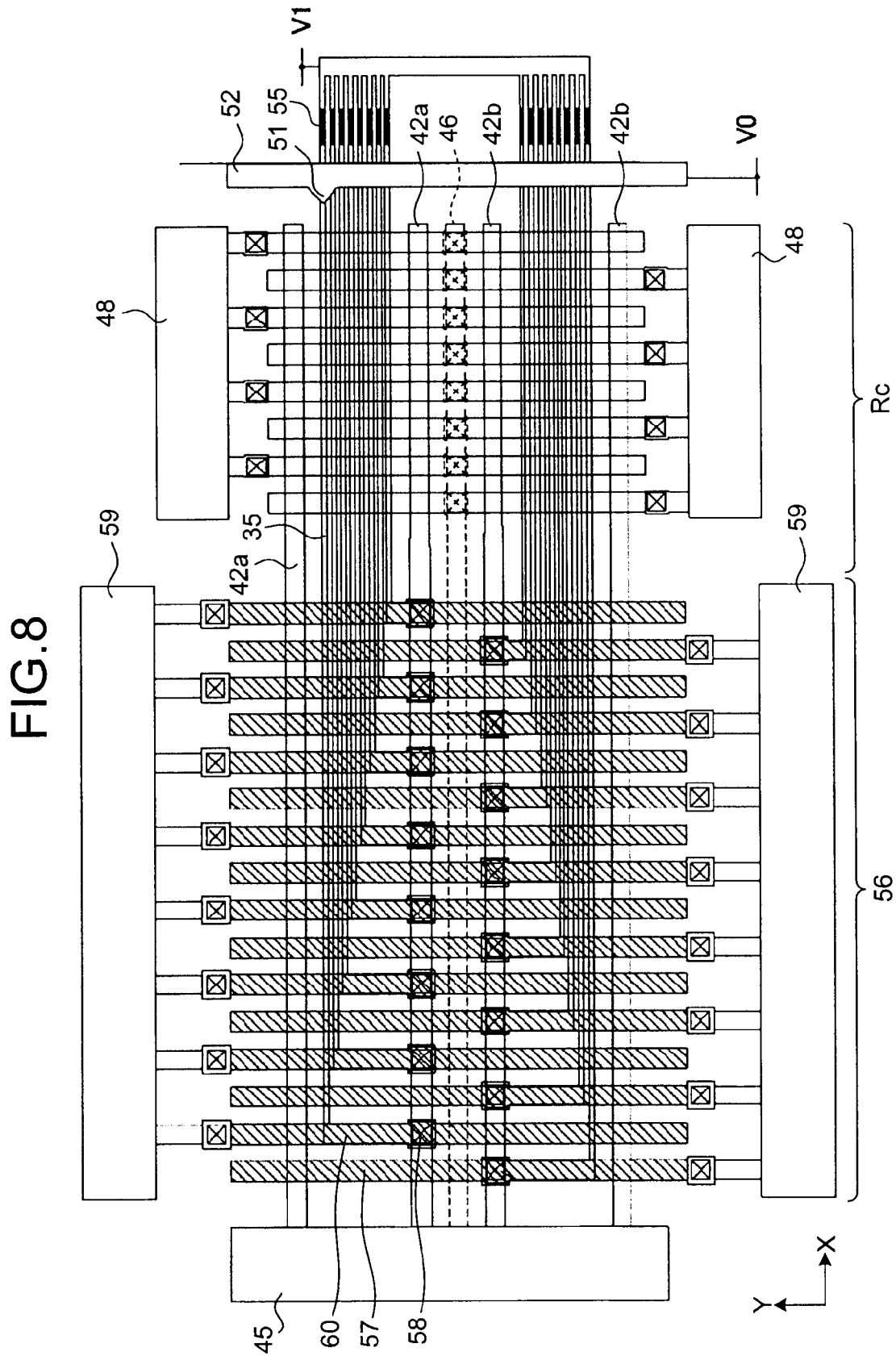
FIG. 8 is a plan view showing a configuration example of a NAND type flash memory having position detecting function of word lines according to a third embodiment.

FIG. 8 is a plan view showing one example of configuration of a NAND type flash memory having position detecting function of a word line according to a third embodiment. The NAND type flash memory further includes a memory cell array region $R_c$ in which the NAND type cell unit 30 is formed in FIG. 1A and a needle position detection unit 56 which detects the word line 35 in which voltage or the like changes because the needle 51 comes into contact with the word line 35 with the selection gate control circuit 45.

The needle position detection unit 56 includes needle position detection wiring 57 to be formed substantially parallel to the bit line 21, a via 58 connecting with the word line 35 to be connected to the needle position detection wiring 57, and a sense amplifier 59 to be connected to the needle position detection wiring 57. In this example shown in FIG. 8, the needle position detection wiring 57 are provided as many as the number of the word lines 35. Furthermore, electrode wiring 60 for connecting by the needle position detection wiring 57 and the via 58 is connected to the word line 35. When the word line 35 is formed by nanoimprint, separately from the memory cell array region $R_c$, for the purpose of a via-forming by photolithography of the minimum processing dimension F capable of positioning, the electrode wiring 60 has not less than the minimum processing dimension F and is formed integrally with the word line 35. The integrated word line 35 and the electrode wiring 60 have L-shape formation. The via 58 electrically connects the electrode wiring 60 to the needle position detection wiring 57. In addition, although not shown in the drawing, an insulation layer is formed above the L-shaped word line 35 and the electrode wiring 60, electrode material is embedded in a via hole formed in the insulation layer to form the via 58, and the needle position detection wiring 57 is formed on the insulation layer so as to be connected to the via 58.

In the needle position detection unit 56, for example, when the needle 51 comes into contact with any of the word lines 35, voltage change due to the needle 51 is measured by the sense amplifier 59 connected to the needle position detection wiring 57. Thereby, it is detected which word line 35 is kept contact with the needle 51.

In addition, FIG. 8 shows the case where sixteen needle position detection wiring 57 are formed so as to have a relationship of 1 to 1 with respect to sixteen word lines 35, however, the relationship of 1 to 1 between the number of the word lines 35 and that of the needle position detection wiring 57 is not required. For example, in the case where there exist more word lines 35 on the substrate, a plurality of word lines 35 may be shared to connect with one needle position detection wiring 57. By doing so, increase of an occupied area of the needle position detection unit 56 can be prevented. In this regard, however, in the case where a plurality of word lines 35 are connected to one needle position detection wiring 57, in response to the NAND type cell unit 30 shown in FIG. 2, it is necessary for a plurality of word lines 35 so as not to be electrically connected to the same needle position detection wiring 57 at the same time, by providing a selection transistor one each in the vicinity of the via 58 and the like.

Figure 9A:
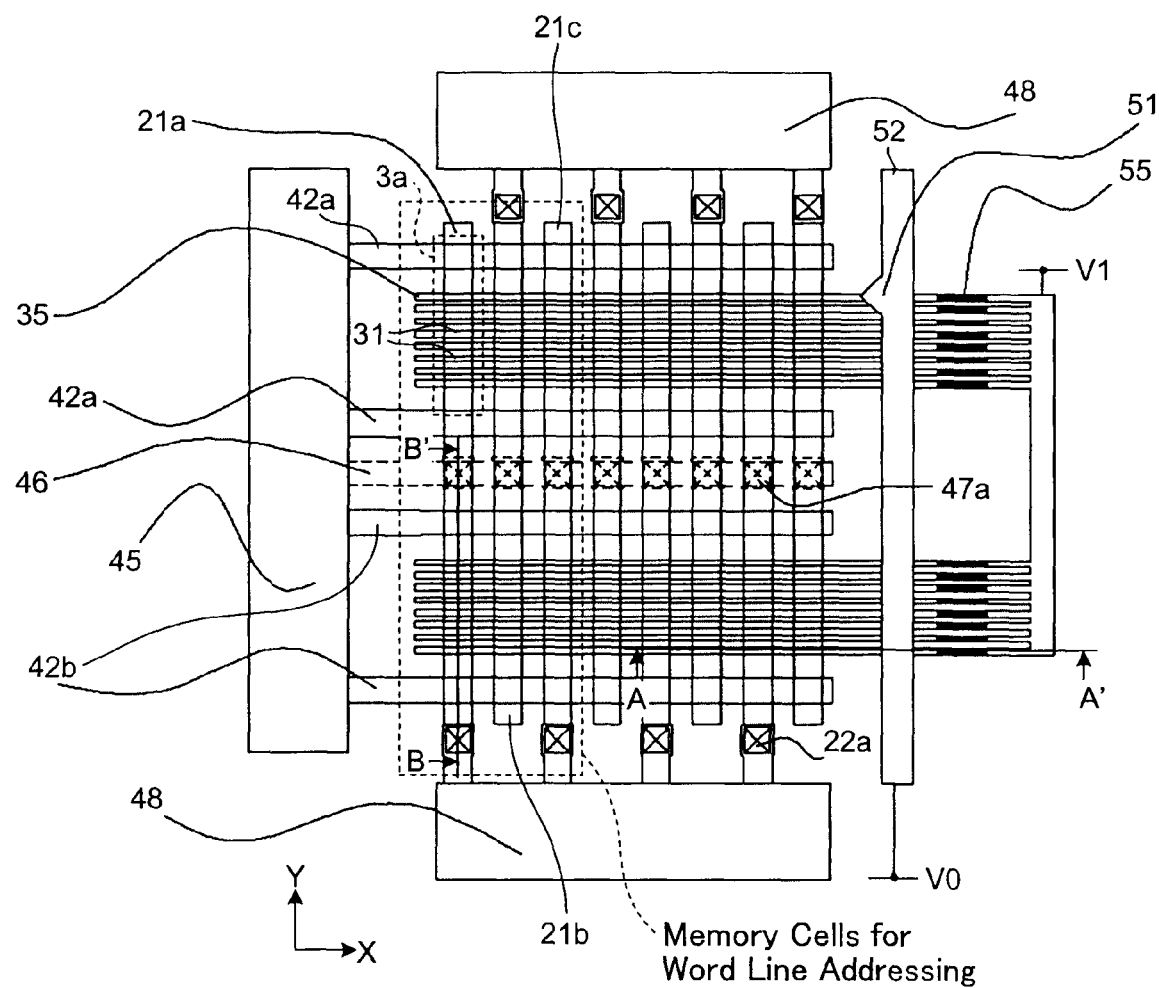

FIGS. 9A and 9B are explanatory views showing another example of a procedure of a method of detecting a position of a word line with which the needle contacts.

As shown in FIG. 9A, one of NAND rows is composed of eight memory cells between a pair of the selection gate control lines 42*a*. It is assumed that the width of the bit lines can be detected by the needle 51 which is driven by the driving mechanism. In order to determine which word line is selected, the manufactured memory cell itself is used in the present example.

"Memory cells for word line addressing" having a structure same as that in the other memory cells are used for detecting that which word line is being contact with the needle.

In FIGS. 9A and 9B, the memory cells disposed on the bit lines 21*a* to 21*c* have been previously recorded thereon different numerals corresponding to such as 0 or 1 within 0 to 7 represented in a binary number. This is because the recorded numerals can identify which word line is selected within eight word lines 35*a* to 35*h* which are disposed intersecting between a pair of selection gate control lines 42*a*. The recorded numerals can be used for positioning the needle with high-accuracy such as an electronic-microscope level in a fabrication process. Alternatively, the recorded numerals can be used to determine an original point of a positioning in a fabrication process. Instead of the numerals, other information such as an address or the like may be used.

In this situation, based on an ordinary readout procedure from a memory, it is possible to determine one word line selected by the needle 51 using the readout numeral from corresponding bit lines 21*a* to 21*c* within eight word lines 35*a* to 35*h* of one NAND row.

According to the third embodiment, there is an advantage in that, as for which gate line 35 is kept contact with the needle 51, position detection can be performed.

Figure 10:
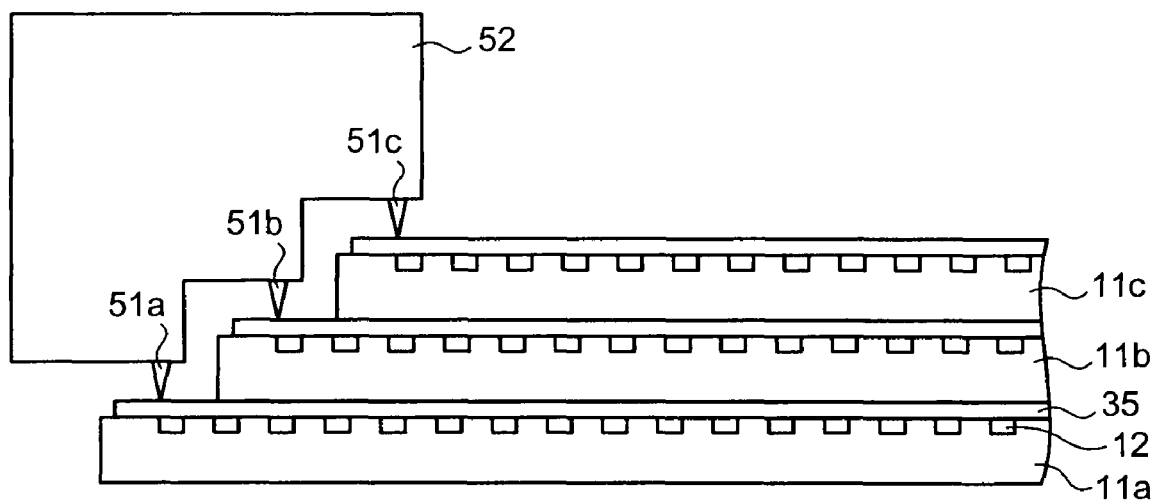
FIG. 10 is a partial side view schematically showing a configuration example of a nonvolatile memory according to a fourth embodiment.

There is known a three dimensionally laminated NAND type flash memory having a structure in which the word line is laminated in plural numbers in a direction perpendicular to the substrate surface and the memory cell is further laminated in plural numbers in a direction perpendicular to the substrate surface. The word lines 35 of the three dimensionally laminated NAND type flash memories are formed by the aforementioned nanoimprint or the like and the word line 35 can be selected by the needle 51 as described above. In this regard, however, in the case of the nonvolatile storage device having such shape, it is required that taper etching is performed in the extending direction of the word line 35 to expose the laminated internal word line 35 on the surface. Thereby, it is possible to put the needle 51 into contact with the word line 35. As shown in FIG. 1, the needle 51 may come into contact with only one part of the word line 35 and therefore the substrate formed with the NAND type flash memories shown in FIG. 1 may be laminated in plural layers. FIG. 10 is a partial side view schematically showing a configuration example of a nonvolatile memory according to a fourth embodiment. FIG. 10 shows a state where the substrate 11 formed with the aforementioned NAND type flash memory is laminated in three layers. That is, an adhesive agent or the like is applied onto the surface of the element formation side of the substrate 11 shown in FIG. 1 to adhere to the surface of the substrate side of the other substrate 11 so as to be laminated in plural layers. At this time, in order to secure contact portions between the needles 51a to 51c in each layer, ends of the respective substrates 11 are not arranged at the same position in line, but the ends of the respective substrates 11a to 11c are shifted to secure space so that each of the needles 51a to 51c can come into contact with the associated word line 35. Furthermore, the needles 51a to 51c are provided with respect to the respective substrates 11a to 11c, thereby allowing accessing to the associated word line 35 of the respective substrates 11a to 11c simultaneously.

According to the fourth embodiment, there is an advantage in that the storage capacity can be enhanced without increasing an area of the nonvolatile storage device.

In a fifth embodiment, a NAND type flash memory and a method of manufacturing the same which includes a word line address decoder for selecting one word line of a plurality of word lines formed using lithography in which the minimum processing dimension is smaller than that of photolithography such as nanoimprint, will be described.

Figure 11:
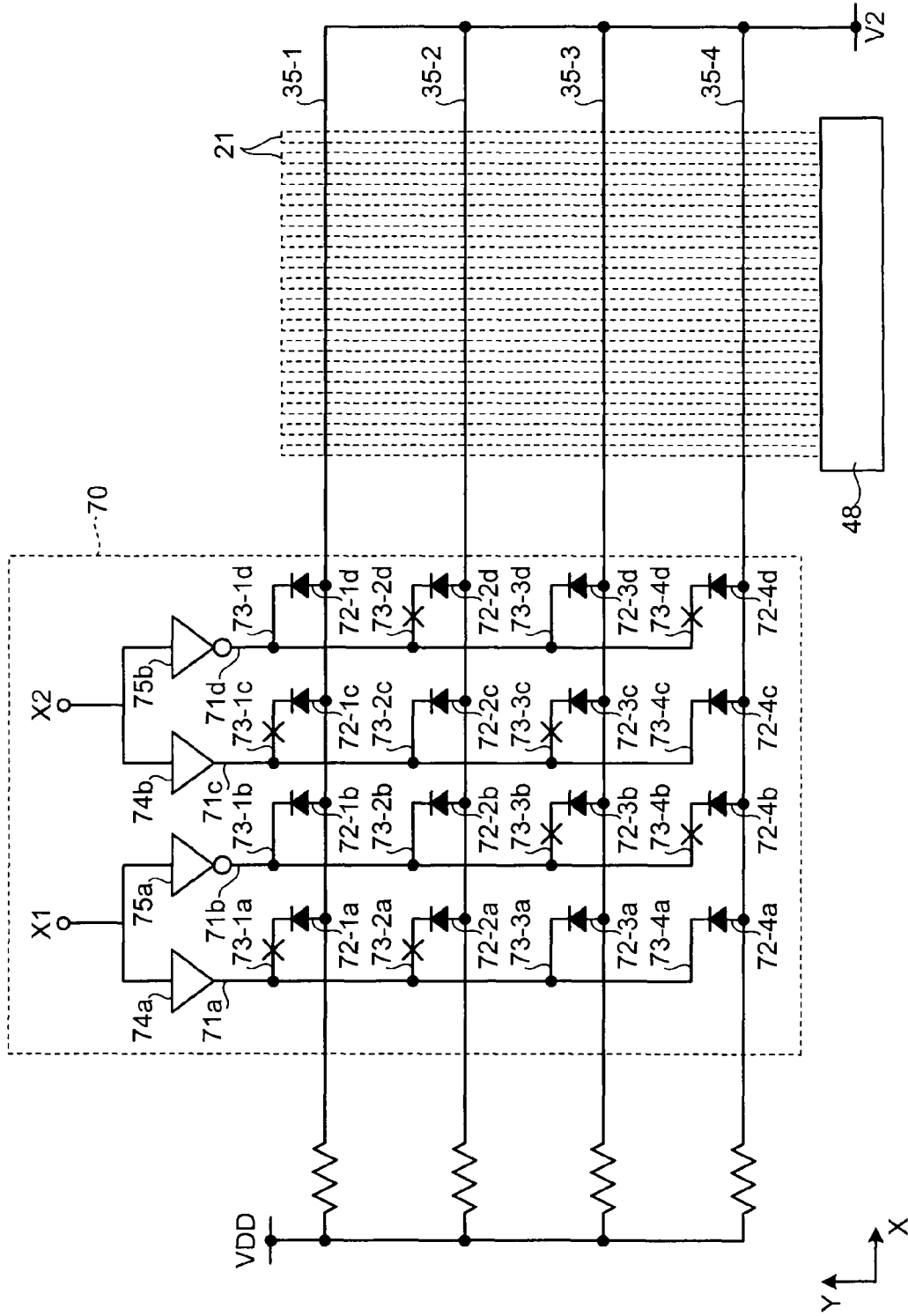
FIG. 11 is a view schematically showing a NAND type flash memory according to a fifth embodiment.

FIG. 11 is a view schematically showing configuration of a NAND type flash memory according to the fifth embodiment. In the NAND type flash memory, a word line address decoder 70 is arranged in word lines 35-1 to 35-4 extending from a region (hereinafter, referred to as memory cell array region) in which memory cell arrays are arranged, in place of the needle shown in FIG. 1 of the first embodiment. The word line address decoder 70 is a circuit capable of selecting one desired word line 35 in response to a voltage (an address signal: corresponding to an electric signal in the scope of claims) to be inputted to decoding wiring 71a to 71d by breaking of wire of a fuse or short-circuit of an antifuse 73 at a predetermined position, using a PLA (Programmable Logic Array) composed of arrangement of continuity state conversion films such as the fuses or antifuses 73 provided at intersections of the word lines 35-1 to 35-4 and the decoding wiring 71a to 71d. A region formed with the word line address decoder 70 is referred to as an address decoder forming region in this specification. In addition, the same reference numerals are given to the same constitutional elements as the first embodiment and their description will not be repeated. In this regard, however the selection gate control line and the selection gate control circuit in the first embodiment are not shown in the drawing.

The PLA includes the decoding wiring 71a to 71d formed by photolithography capable of positioning, and the antifuse 73 (or fuse) and a diode 72 connected in series at each of the intersections of the word lines 35-1 to 35-4 and the decoding wiring 71a to 71d in the direction perpendicular to the extending direction of the word lines 35-1 to 35-4. The number of wiring (decoding wiring 71) necessary for addressing is generally 2n in the case where the number of the word line 35 is $2^n$ (n is natural number). FIG. 11 exemplifies the case where four word lines 35-1 to 35-4 are provided, it is n=2 ($4=2^2$) and therefore 4 (=2×2) decoding wiring 71a to 71d are provided in the PLA.

In the word line address decoder 70 formed from the PLA, antifuses 73-1b and 73-1d on the word line 35-1 are in a conductive state, antifuses 73-2b and 73-2c on the word line 35-2 are in a conductive state, antifuses 73-3a and 73-3d on the word line 35-3 are in a conductive state, and antifuses 73-4a and 73-4c on the word line 35-4 are in a conductive state. One of the word lines 35-1 to 35-4 is selected in response to an address signal to be inputted from input terminals X1 and X2 by combination of the antifuses in a conductive state.

Selection operation of the word lines 35-1 to 35-4 of such word line address decoder 70 will be described. In the word line address decoder 70, when outputs of either buffer 74a and 74b or inverters 75a and 75b become L-level (ground potential denoted by V2), current flow through the antifuses in a conductive, which are connected to the decoding wiring 71a to 71d to be connected to the buffers 74a and 74b or the inverters 75a and 75b, as a result, the current also flow the word lines 35-1 to 35-4 to be connected to the buffers 74a and 74b or the inverters 75a and 75b, so that voltage becomes L. Then, under such conditions, there exists any one of the word lines 35-1 to 35-4 in which no current flows though the voltage becomes substantially VDD, that is, H level. That is, it becomes a state where the word line to which the voltage of VDD is applied but the current does not flow is selected by the word line address decoder 70.

More specifically, in a state where a predetermined voltage VDD is applied to all the word lines 35-1 to 35-4, for example, when H and H as address signal are inputted to the input terminals X1 and X2 respectively, output of the inverters 75a and 75b becomes L (0V), current flow through the antifuses 73-1b, 73-1d, 73-2b, and 73-3d in a conductive state, and voltage of the word lines 35-1 to 35-3 to be connected to the antifuses 73-1b, 73-1d, 73-2b, and 73-3d becomes 0V and the voltage VDD is applied only to the word line 35-4 through which no current flows and becomes a selection state. Similarly, for example, when H and L as the address signals are inputted to the input terminals X1 and X2 respectively, output of the inverter 75a and the buffers 74b become L (0V), current flow through the antifuses 73-1b, 73-2b, 73-2c, and 73-4c in a conductive state and voltage of the word lines 35-1, 35-2, and 35-4 to be connected to the antifuses 73-1b, 73-2b, 73-2c, and 73-4c become 0V, and the voltage VDD is applied only to the word line 35-3 through which no current flows and becomes a selection state. Furthermore, when L and H as the address signals are inputted to the input terminals X1 and X2 respectively, output of the buffer 74a and the inverter 75b become L (0V), current flow through the antifuses 73-1d, 73-3a, 73-3d, and 73-4a in a conductive state and voltage of the word lines 35-1, 35-3, and 35-4 to be connected to the antifuses 73-1d, 73-3a, 73-3d, and 73-4a become 0V, and the voltage VDD is applied only to the word line 35-2 through which no current flows and becomes a selection state. Further, when L and L as the address signals are inputted to the input terminals X1 and X2 respectively, output of the buffer 74a and 74b become L (0V), current flow through the antifuses 73-2c, 73-4c, 73-3a, and 73-4a in a conductive state and voltage of the word lines 35-2 to 35-4 to be connected to the antifuses 73-2c, 73-4c, 73-3a, and 73-4a become 0V, and the voltage VDD is applied only to the word line 35-1 through which no current flows and becomes a selection state. In doing so, the word line address decoder 70 formed from the PLA can select one word line from the word lines 35-1 to 35-4.

Now, a method of manufacturing a NAND type flash memory having such configuration will be described. Structure of a memory cell here is a metal oxide nitride oxide silicon (referred to as MONOS) type NAND type flash memory different from that of the first embodiment. FIGS.

Figure 12A:
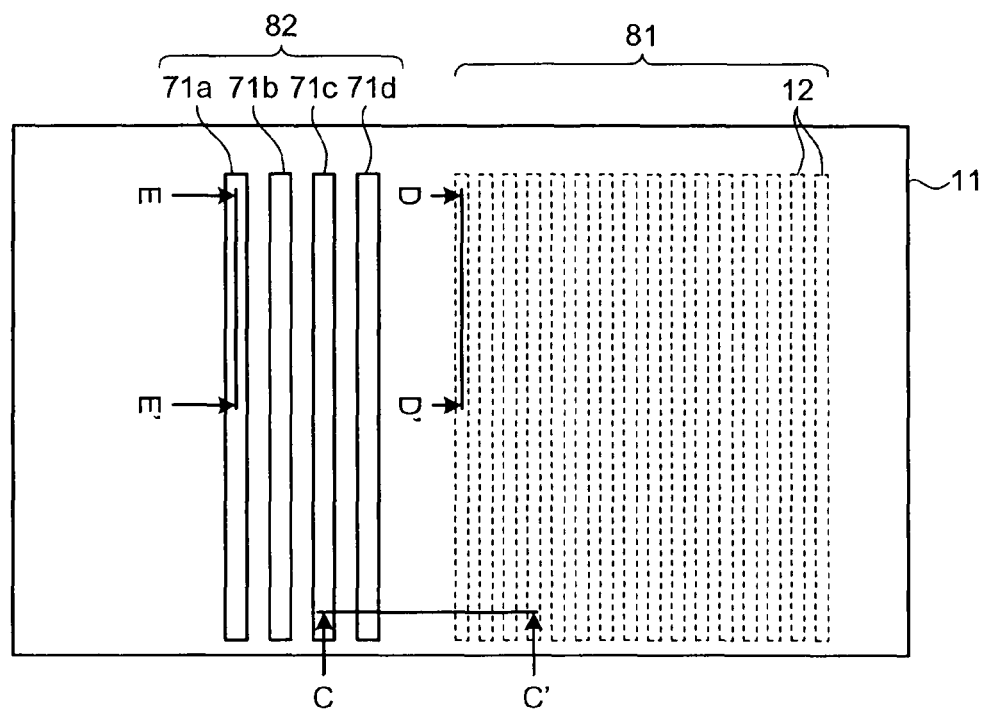
FIGS. 12A and 12B are plan views schematically showing an example of a procedure of a manufacturing method of the NAND type flash memory.
Figure 12B:
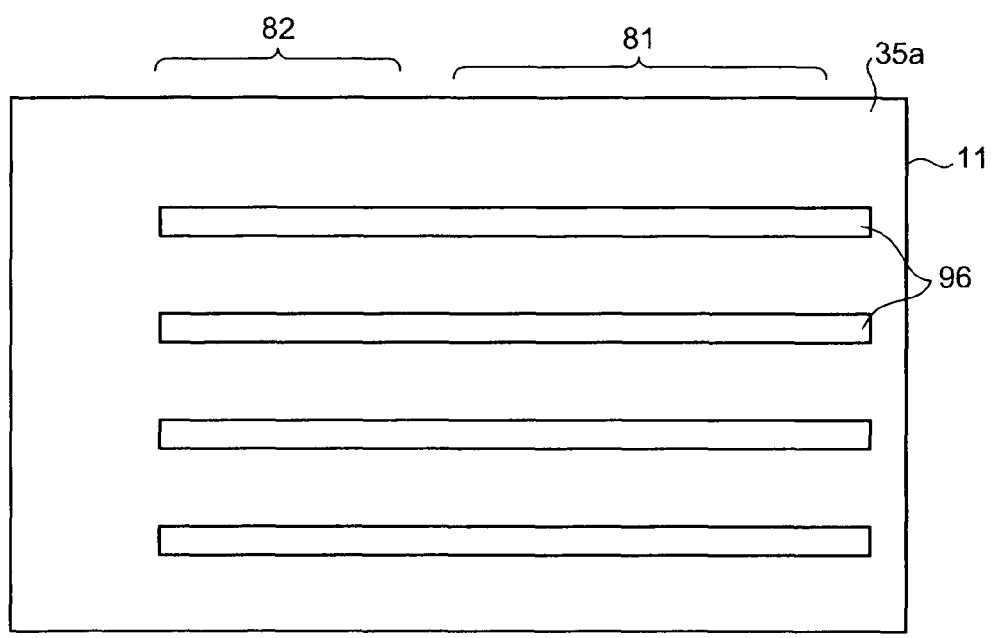

12A to 16C are views showing an example of a procedure of a manufacturing method of a NAND type flash memory. FIGS. 12A and 12B are plan views schematically showing an example of a procedure of a manufacturing method of the NAND type flash memory. Furthermore, FIGS. 13A to 13H are sectional views showing an example of a procedure of a manufacturing method, seen from the line C-C' shown in FIG. 12A, FIGS. 14A and 14B are sectional views showing an example of a procedure of a manufacturing method, seen from the line D-D' shown in FIG. 12A, and FIGS. 15A to 15C are sectional views showing an example of a procedure of a manufacturing method, seen from the line E-E' shown in FIG. 12A. Further, FIG. 16A is a plan view schematically showing a NAND type flash memory having a PLA composed of antifuses, FIG. 16B is a view showing an example of a process for short-circuiting the antifuses, and FIG. 16C is a view showing a state where a continuity state of the antifuses is changed according to a program.

Figure 13A:
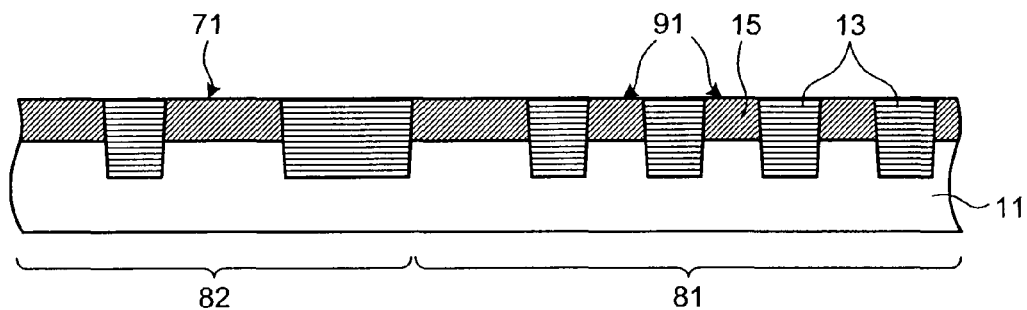
FIGS. 13A to 13H are sectional views showing an example of a procedure of a manufacturing method, seen from the line C-C' shown in FIG. 12A.
Figure 14A:
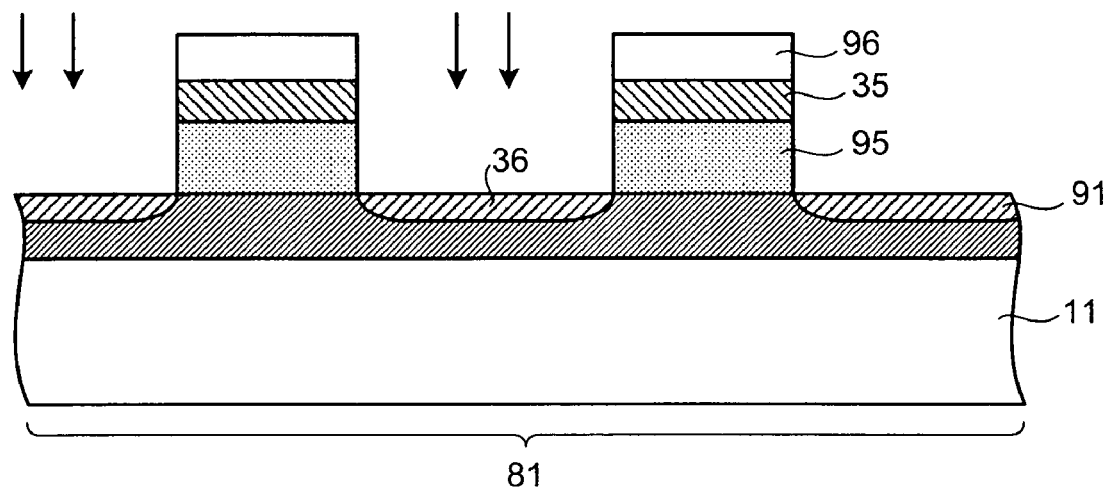
FIGS. 14A and 14B are sectional views showing an example of a procedure of a manufacturing method, seen from the line D-D' shown in FIG. 12A.
Figure 14B:
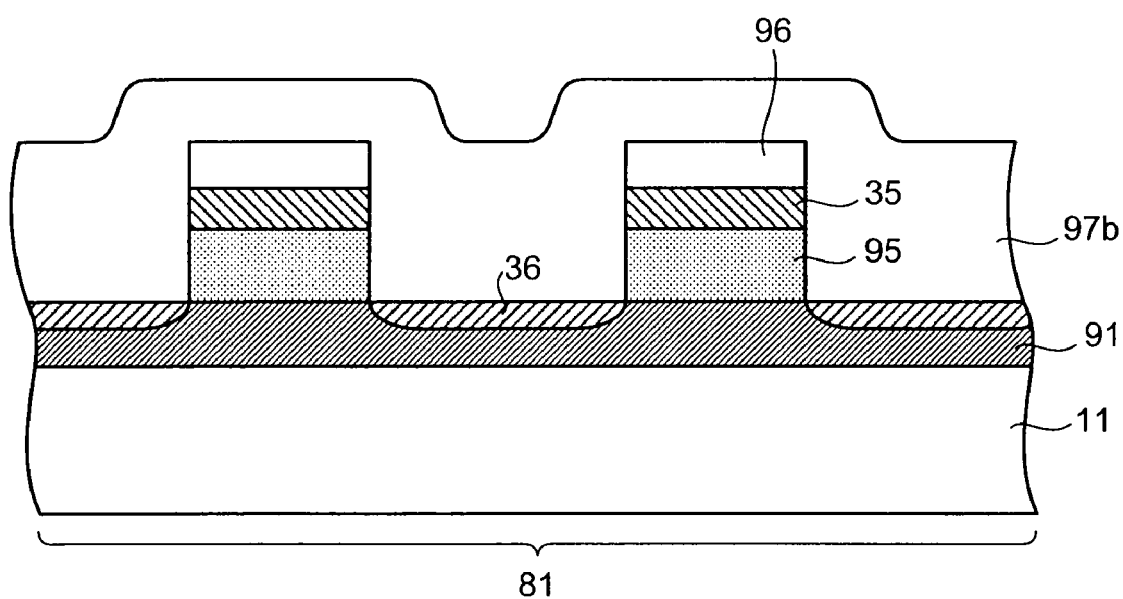

First, as shown in FIGS. 12A and 13A, a predetermined conductivity type impurity dopant is diffused into the surface of the substrate 11 such as a silicon single-crystal substrate using the ion injection method or the like to form a well. Here, a p-type impurity dopant is diffused to form a p-type well 91. Then, same as in the case of the first embodiment, a trench is formed in the Y axis direction at predetermined positions of a memory cell array region 81 and an address decoder forming region 82 and the trench is embedded with an insulating film to form an element isolation insulating film 13. Regions sandwiched by the element isolation insulating films 13 becomes an element forming region 12 in the memory cell array region 81 and decoding wiring 71 in the address decoder forming region 82. In addition, in this example, sixteen element forming regions 12 are formed in the memory cell array region 81 and, for example, four p-type decoding wiring 71a to 71d are formed in the address decoder forming region 82.

Figure 13B:
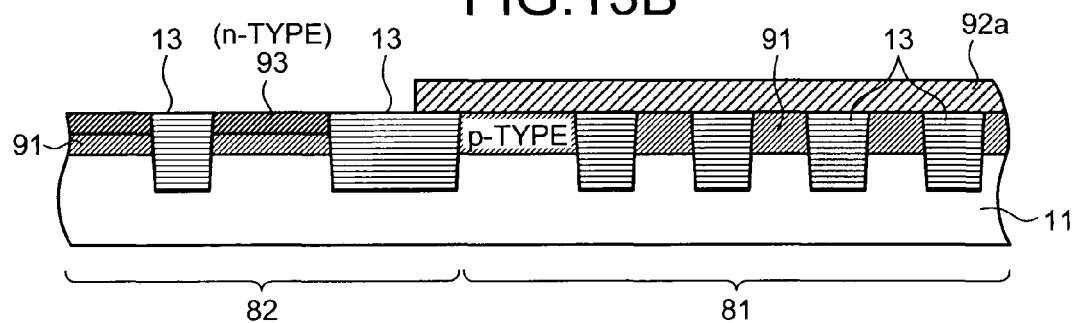

Then, as shown in FIG. 13B, after a protective film 92a made of $Si_3N_4$ or the like is formed on the entire surface of the substrate 11 on the side formed with the element isolation insulating film 13, portion of the decoding wiring 71a to 71d (the address decoder forming region 82) is exposed using ordinary photolithography, wet etching, and the like. Then, the protective film 92a is used as a mask, ion injection is performed so that the region at a predetermined depth from the surface of the decoding wiring 71a to 71d becomes n-type to form an n-type layer 93. Thereby, in the forming region of the decoding wiring 71a to 71d, the n-type layer 93 is formed on the surface of the p-type well 91 to form a pn junction 72.

Figure 13C:
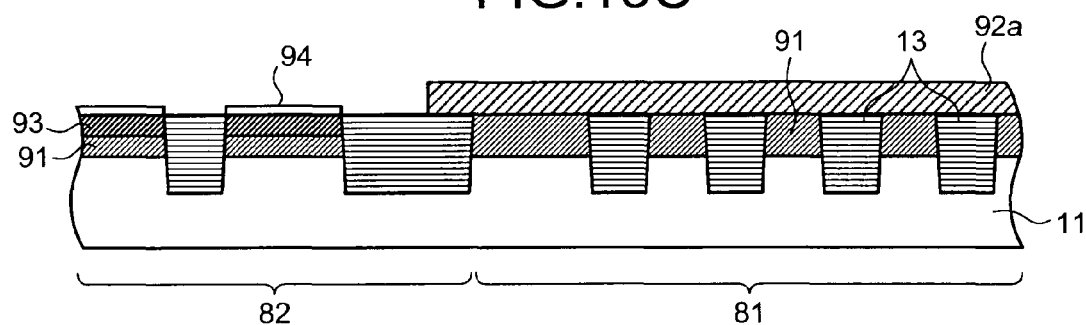

Next, as shown in FIG. 13C, the surface of the n-type layer 93 in the portion of the decoding wirings 71a to 71d is oxidized to form an antifuse insulating film 94 made of a $SiO_2$ layer. After that, the protective film 92a, which covers the memory cell array region 81, is removed to form a new protective film 92b made of $Si_3N_4$ or the like on the entire surface of the substrate 11.

Figure 13D:
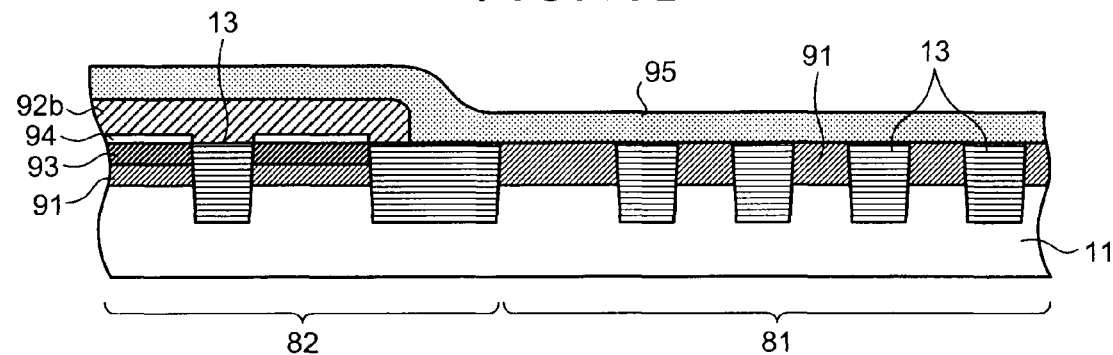
Figure 13E:
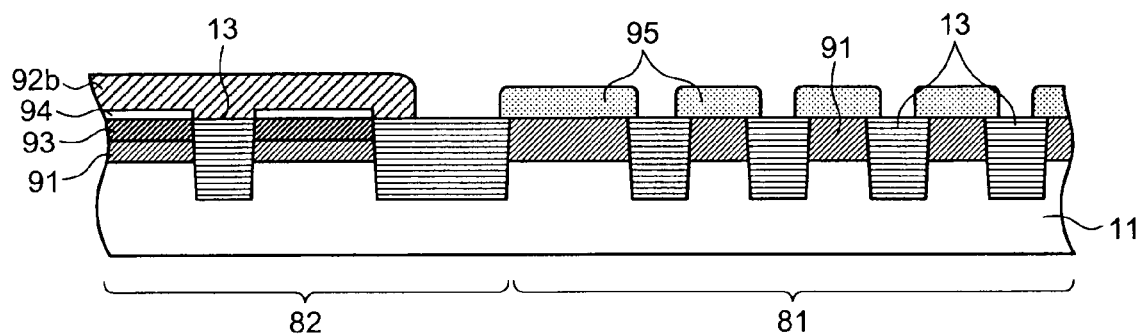

Then, as shown in FIG. 13D, the address decoder forming region 82 is protected using ordinary photolithography, wet etching, and the like to form a pattern so as to expose the memory cell array region 81. After that, an ONO ($SiO_2$/$Si_3N_4$/$SiO_2$) film 95 is formed on the entire surface of the substrate 11. In addition, in the drawing, the ONO film 95 is depicted as a unit, for the sake of simplicity. $Si_3N_4$ in the ONO film 95 has a role as a memory layer in the memory cell array region 81. After that, as shown in FIG. 13E, patterning is performed so that the ONO film 95 is remained on the p-type well 91 parallelly in a length direction of the element isolation insulating film 13 by ordinary photolithography, the RIE method, and the like.

Figure 13F:
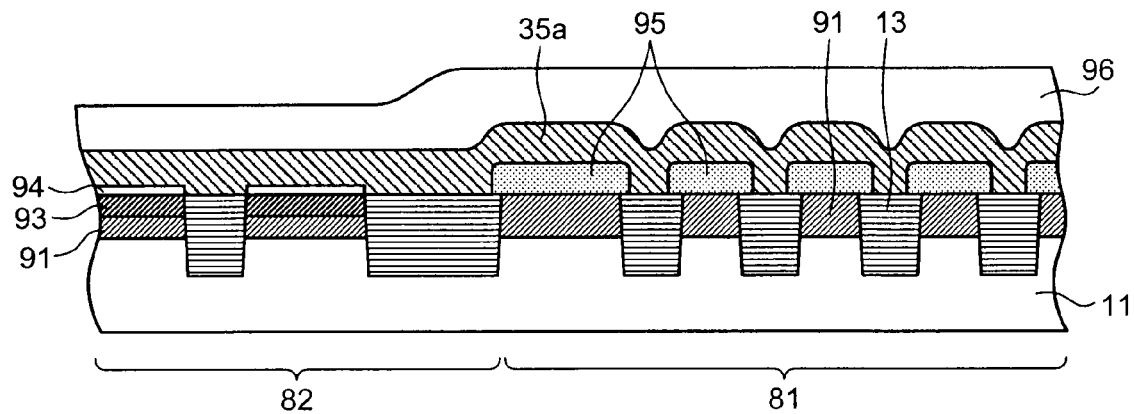

Next, as shown in FIG. 13F, the ONO film 95 of the address decoder forming region 82 and the protective film 92b are removed by ordinary photolithography, the RIE method, and the like. After that, a word line conductive material film 35a, which becomes the word line, is formed on the entire surface of the substrate 11 and a nanoimprint resist 96 is further formed thereon. As a resist for this, poly methyl methacrylate (referred to as PMMA) or the like can be used.

Then, as shown in FIG. 12B, a word line forming pattern 96 is formed by nanoimprint using molding for forming a pattern of the word line 35, as in the procedure described in the first embodiment. In addition, the word line forming pattern 96 is formed extending not only to the memory cell array region 81 but also to the address decoder forming region 82.

Figure 13G:
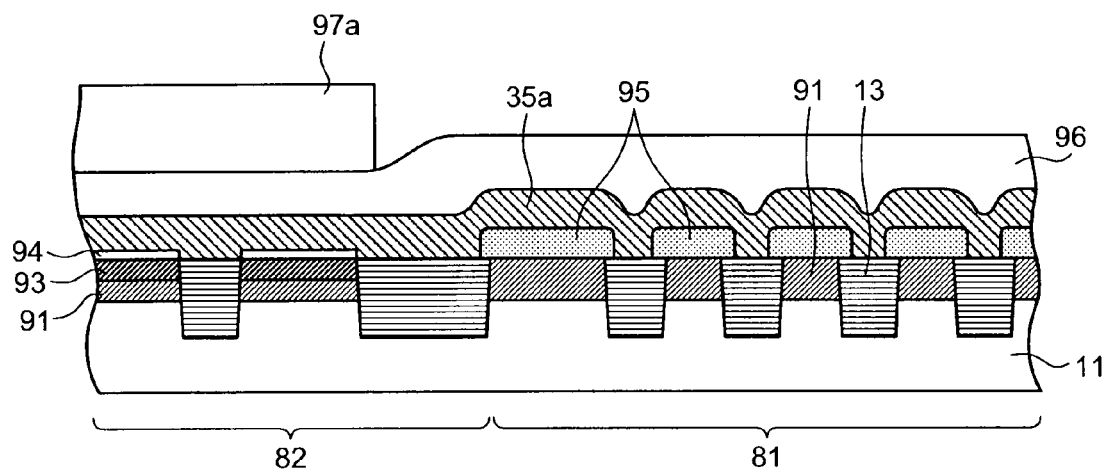

After that, as shown in FIG. 13G, a resist 97a is applied on the entire surface of the substrate 11 formed with the word line forming pattern 96 to protect the address decoder forming region 82 by ordinary photolithography and to form a pattern such that the memory cell array region 81 is exposed. For example, in the case where material of the word line forming pattern 96 to be used in nanoimprint is PMMA and the resist 97a to be used in ordinary photolithography is a novolac type positive resist, the resist 97a can be separated while the word line forming pattern 96 formed by underlying nanoimprint is remained by appropriately selecting developing solution (for example, organic alkaline solution) and resist peeling solution (for example, n-methylpyrrolidone (referred to as NMP)).

In this state, as shown in FIG. 14A, the word line forming pattern 96 formed by nanoimprint is used as a etching mask, patterns of the word line conductive material film 35a and the ONO film 95 are etched together, and the surface of the substrate 11 is exposed to form the pattern of the word line 35. After that, ion injection is performed with the pattern of the formed word line 35 being used as a mask, and diffusion layers are formed in regions on the substrate 11 sandwiching the word lines 35 to form source/drain regions 36. Here, n-type impurity dopant is doped by ion injection to form an n-type diffusion layer. After that, the resist 97a covering the address decoder forming region 82 is removed.

Figure 13H:
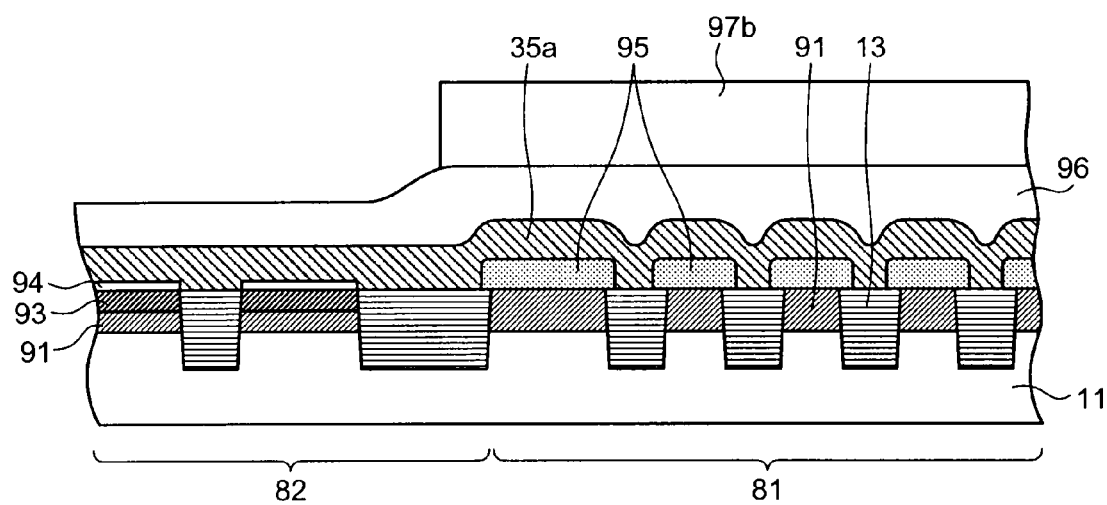
Figure 15A:
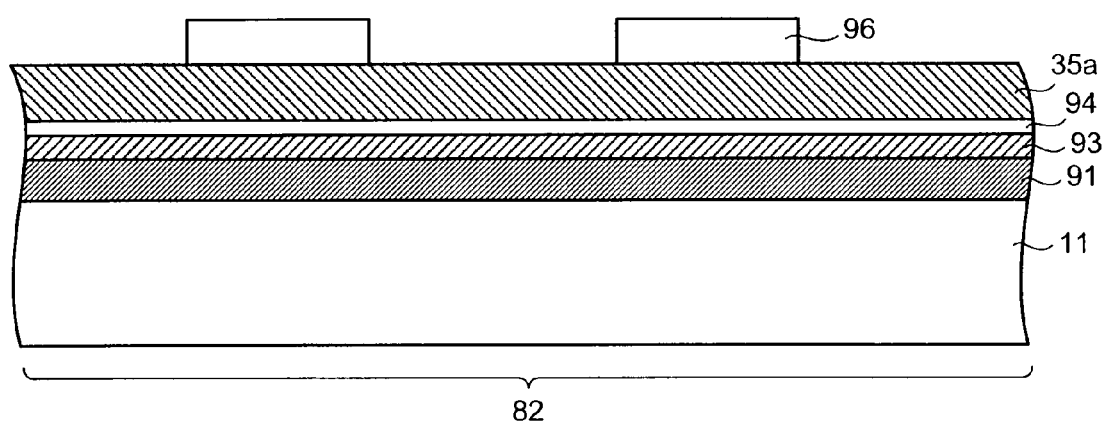
FIGS. 15A to 15C are sectional views showing an example of a procedure of a manufacturing method, seen from the line E-E' shown in FIG. 12A.

Next, as shown in FIGS. 13H, 14B, and 15A, the resist 97b is applied again on the entire surface of the substrate 11 on the side formed with the word line 35, the memory cell array region 81 is protected by ordinary photolithography, and a pattern is formed such that the address decoder forming region 82 is exposed. FIG. 14B shows a state of a section of the memory cell array region 81 in which the resist 97b of such pattern is formed, and FIG. 15A shows a state of a section of the address decoder forming region 82 in which the resist 97b is removed.

Figure 15B:
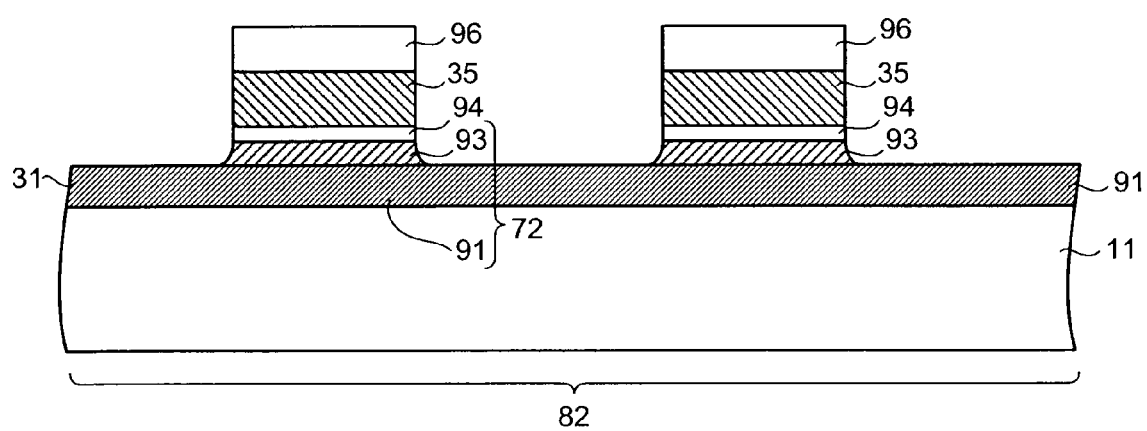

After that, as shown in FIG. 15B, the word line forming pattern 96 formed by nanoimprint is used as an etching mask, and patterns of the word line 35 and the antifuse insulating film 94 are etched together to expose the surface of the substrate 11. Subsequently, the n-type layer 93 formed on the surface of the substrate 11 formed by the process shown in FIG. 13B is removed by etching such as the RIE method or the like. Thereby, a pn junction can be formed just below the portion covered with the word line forming pattern 96 formed by nanoimprint. That is, one diode (pn junction) 72 is formed per one intersection between the decoding wiring 71 portion made of p-type Si on the substrate 11 and the word line 35. Furthermore, the antifuse insulating film 94 made of $SiO_2$ is formed on the diode 72 and the antifuse insulating film 94 is used as the antifuse 73.

Figure 15C:
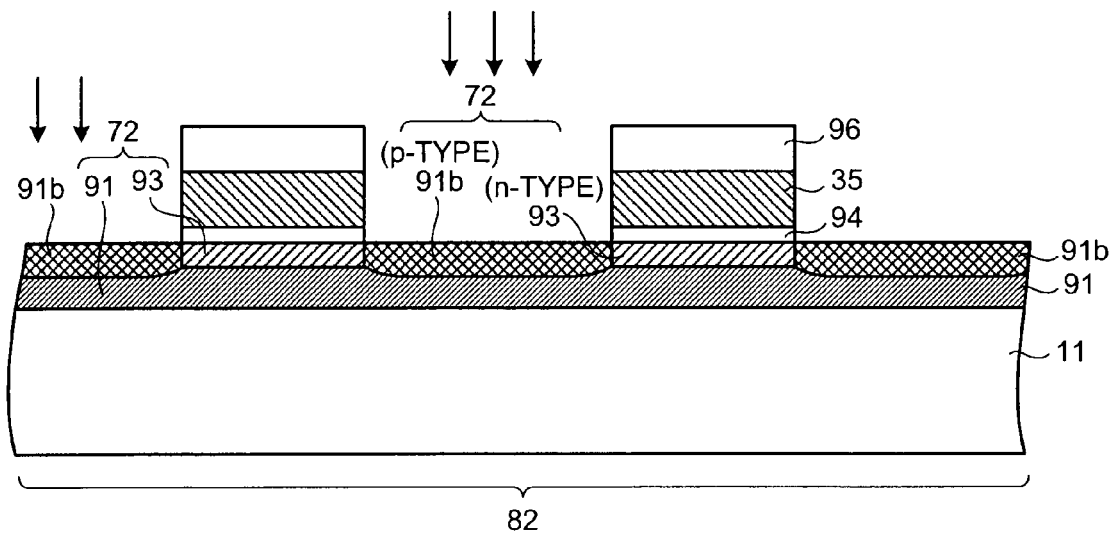

In addition, in FIG. 15B, the n-type layer 93 on the substrate 11 sandwiched between patterns of the word lines 35 is etched to be removed, however, as shown in FIG. 15C, patterns of the word line 35 and the antifuse insulating film 94 are etched together using the word line forming pattern 96 formed by nanoimprint as an etching mask to expose the substrate 11, and then ion injection may be performed so that the surface of the exposed substrate 11 portion become p-type. In this case, a p-type layer 91b is formed on the surface of the substrate 11 between the patterns of the word lines 35. After that, the resist 97b and the word line forming pattern 96 are removed.

Thereby, the diode (pn junction) 72 and the antifuse 73 are formed between the word line 35 and the decoding wiring 71 of the address decoder forming region 82. Furthermore, the buffer 74 and a logic gate circuit of the inverter 75 are alternatively arranged in the decoding wiring 71 and the buffer 74 and the inverter 75 are set as a pair to be connected to one input terminal X1. In FIG. 11, the word lines 35-1 to 35-4 are four and the decoding wiring 71a to 71d of PLA are four, and therefore, sixteen pairs of the diodes 72 and the antifuses 73 are formed. Furthermore, two input terminals X1 and X2 are formed and the buffers 74 and inverters 75 are respectively formed in the two decoding wiring 71a to 71d to be connected to the respective input terminals X1 and X2.

As described above, as shown in FIG. 16A, the NAND type flash memory having the PLA composed of the antifuses 73 as the word line address decoder 70 can be obtained. That is, it becomes a state that the diode 72 and the antifuse 73 are formed at each of the intersections of the word lines 35-1 to 35-4 and the decoding wiring 71a to 71d of the PLA constituting the word line address decoder 70, and it becomes a state that any of the antifuses 73 is not short-circuited.

Consequently, a manufacturer of the nonvolatile semiconductor storage device programs the antifuse 73 at which position will be short-circuited in order to function the PLA in such connected to four word lines 35-1 to 35-4 as the word line address decoder 70. That is, the antifuse 73 to be short-circuited is programmed by controlling combination between voltage V0 to be applied to a PLA forming needle 76 which is put into contact with the word lines 35-1 to 35-4 and an address signal (voltage) to be inputted to two input terminals X1 and X2.

Figure 17:
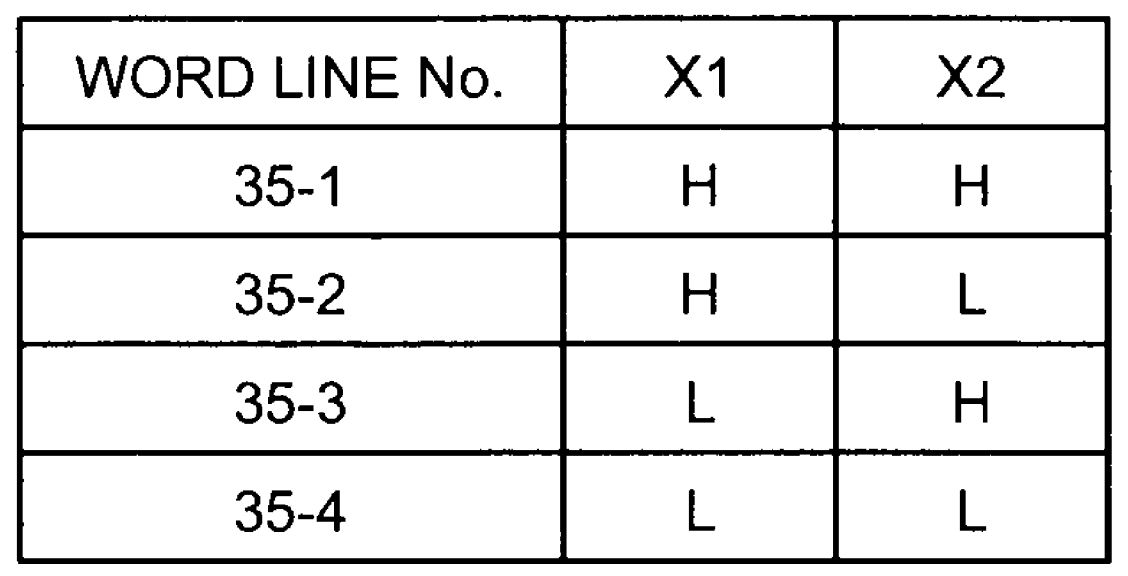

FIG. 17 is a chart showing an example of a combination of address signals to be inputted to the input terminals X1 and X2 in order for short-circuiting a predetermined antifuse by putting a needle into contact with a word line. For example, here, a program is to short-circuit the antifuses 73-1b, 73-1d, 73-2b, 73-2c, 73-3a, 73-3d, 73-4a, and 73-4c. In FIG. 17, "word line No." denotes an identifier which specifies a word line, here, it denotes reference numerals given to the word lines (35-1 to 35-4) and "X1" and "X2" denote an input terminal. Furthermore, "L" and "H" shown at intersections of the word line No. and "X1" and "X2" denote a level of the address signal to be applied to the input terminals "X1" and "X2", "L" denotes a low voltage (low level) and "H" denotes a high voltage (high level).

After that, the antifuse 73 at a predetermined position on the PLA is short-circuited by controlling the address signals to be inputted to the PLA forming needle 76 and the input terminals X1 and X2 according to the program. The PLA forming needle 76 is a probe made by a mechanical driving type MEMS technology for use in a SPM and supported by a supporting member 77 via a driving mechanism not shown in the drawing. Then, the PLA forming needle 76 has a structure capable of moving in the Y-axis direction shown in the drawing by the driving mechanism to apply a predetermined voltage with keeping contact with a predetermined word line 35-1 to 35-4. Here, the voltage V0 to be applied to the PLA forming needle 76 has a magnitude capable of short-circuiting the antifuse 73 when the address signal to be inputted from the input terminals X1 and X2 to the antifuse 73 is L-level. Thereby, the antifuse 73 can be short-circuited by the address signal to be inputted to the input terminals X1 and X2. Here, the address signal for short-circuiting the antifuse 73 is inputted to the input terminals X1 and X2 according to FIG. 17.

For example, in the case where continuity states of the antifuses 73-1a, 73-1b, 73-1c, and 73-1d on the word line 35-1 are set to non-short-circuit, short-circuit, non-short-circuit, and short-circuit respectively, as shown in the line of the word line No. "35-1" of FIG. 17, a H-level address signal is inputted to the input terminals X1 and X2 and the PLA forming needle 76 is put into contact with the word line 35-1 by moving the PLA forming needle 76. At this time, the voltage of the PLA forming needle 76 becomes a voltage such that a potential difference applied across both ends of the antifuse 73-1b and 73-1d to be short-circuited is a potential difference sufficient for dielectric breakdown of the antifuse insulating film 94. Thereby, in the antifuse 73-1a, the address signal of H-level to be inputted to the input terminal X1 is outputted as a voltage of H-level at the buffer 74a, the voltage V0 of the word line 35-1 kept in contact with the PLA forming needle 76 is lower than the voltage H, and therefore, current does not flow into the antifuse 73-1a because of rectification of the diode 72-1a. As a result, the antifuse 73-1a is held in a non-short-circuit state. Meanwhile, in the antifuse 73-2a, the address signal of H-level to be inputted to the input terminal X1 is outputted as a voltage of L-level by the inverter 75a, the voltage V0 of the word line 35-1 kept in contact with the PLA forming needle 76 is lower than the voltage L and therefore voltage is applied to the diode 72-1b in a forward direction, and the antifuse insulating film 94 constituting the antifuse 73-1b is damaged by a large current to be short-circuited. The antifuses 73-1c and 73-1d to be connected to the input terminal X2 are also the same as the antifuses 73-1a and 73-1b, respectively. That is, within the antifuses 73-1a to 73-1d to be connected to the word line 35-1, a state where the antifuses 73-1b and 73-1d are short-circuited is shown in FIG. 16B.

Hereinafter, antifuses 73-2a to 73-4d to be connected to other word lines 35-2 to 35-4 are also performed by the same processing to short-circuit the antifuses at the predetermined positions. A state where a continuity state of the antifuses is changed according to the program shown in FIG. 17 is shown in FIG. 16C. As described above, the word line address decoder 70 is completed. In addition, the PLA forming needle 76 used for short-circuiting the antifuse 73 may be remained in the NAND type flash memory as it is, or it may be removed from the NAND type flash memory as shown in FIG. 11.

Figure 18:
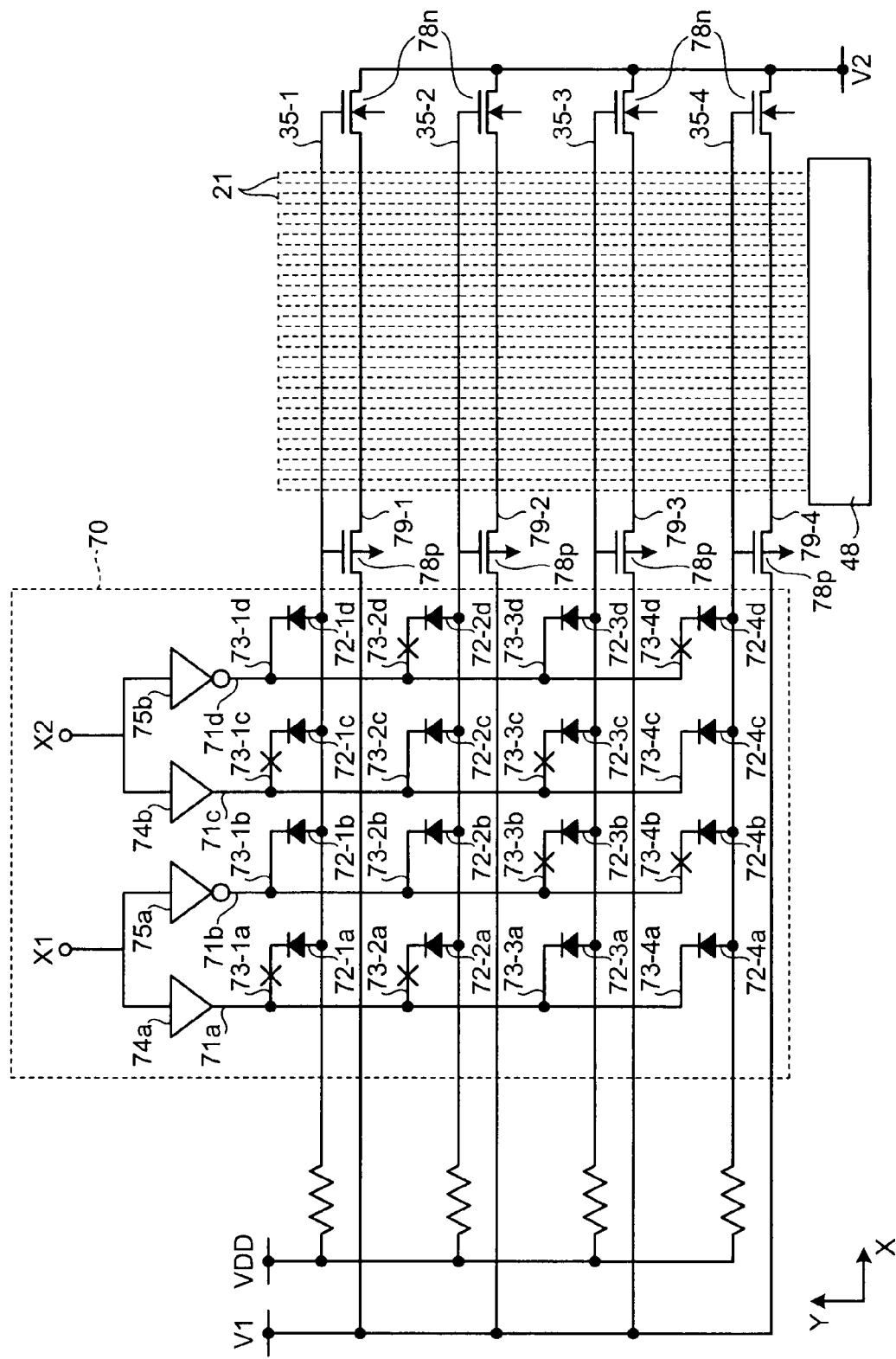
FIG. 18 is a view schematically showing another configuration of the NAND type flash memory according to the fifth embodiment.

Furthermore, as shown in FIG. 18, p-type MOS transistors 78p and n-type MOS transistors 78n are arranged on both sides of a region of memory cells 21 and output lines 79-1 to 79-4 from the word line address decoder 70 are provided in parallel to their respective word lines 35-1 to 35-4. Thereby, voltage can be applied to the word lines 35-1 to 35-4 with the outputs from the word line address decoder 70 amplified, current flowing through the PLA forming needle 76 during writing of the PLA can be decreased, and electric power consumption when reading from or writing to the memory cells can be reduced. It is also possible to manufacture such an element structure by etching the word lines 35-1 to 35-4 and the output lines 79-1 to 79-4 from the word line address decoder 70 together, using a mask formed by nanoimprint used when forming the word lines 35-1 to 35-4.

In addition, in the aforementioned description, the case using the PLA constituted by the antifuses 73 for changing a non-conductive state to a conductive state as the word line address decoder 70 is described, however, a PLA constituted by fuses for changing conductive states to non-conductive states may be used. Also in this case, in order to change conductive states of the fuses, it may be configured that the PLA forming needle 76 is put into contact with wiring to be connected to the word line 35 of the PLA to change voltage so that the fuses become predetermined continuity states. Other than this, as a continuity state conversion film, those which use a change in electrical resistance with phase change of crystal-amorphous generated by supplying current, those which use a change in electrical resistance due to a change in the number of charge, or the like may be used. Furthermore, in the fifth embodiment, a nonvolatile storage device such as the NAND type flash memory is exemplified, however, as shown in FIG. 11, if it is a storage device using a structure in which the bit lines 21 intersect with the word lines 35 and memory cells are formed at their intersections, the invention of the fifth embodiment can be applicable to not only a nonvolatile storage device but also a volatile storage device.

According to the fifth embodiment, in addition to the advantage of the first embodiment, the word line address decoder 70 which is configured by cutoff of a fuse or short-circuit of the antifuse 73 is also connected to the word line 35, and therefore, there are advantages in that selection of the addressing line can be performed at high speed, speed of writing, reading, and erasing can be increased, and a nonvolatile memory with a large storage capacity can be formed, as compared with the case where addressing of the word lines is performed by the needle.

Furthermore, when a circuit for addressing the word lines is manufactured by a programmable logic array, the word lines are selected by the needle in which a predetermined voltage is applied, a voltage to be applied to the decoding wiring is changed to change continuity states of the fuses or the antifuses formed at the intersections of the word lines and the decoding wiring, and therefore, there is also an advantage in that the address decoder which performs addressing of the word lines using lithography with no positioning accuracy can be manufactured.

As described above, the nonvolatile storage device according to the present invention is useful for a memory having storage elements arranged in series.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a nonvolatile storage device which includes a plurality of bit lines arranged in a column direction on a substrate; a plurality of word lines arranged in a row direction on the substrate; a memory cell array having a plurality of memory cells each of which is arranged at each of intersections of the bit line and the word line, where a store state of each of the memory cells changes according to an electric signal relatively applied to the word line and the bit line; a word line selection unit having a needle relatively movable with respect to the substrate which comes into contact with one word line of the plurality of word lines, setting the word line in contact with the needle to a selection state; and a sense amplifier detecting through the bit line the store state of the memory cell to be connected to the word line which is set to the selection state by the word line selection unit, the method comprising:

forming a conductive material film which becomes the word lines electrically connecting the memory cells of the same row on the substrate;

forming a mask on the conductive material film for forming the word line by lithography using any one of a nanoimprint, an electron beam exposure, and a block copolymer;

forming the word lines using the mask by removing at least the conductive material film within a region not being masked; and placing the needle movable in a direction perpendicular to an extending direction of the word lines, coming into contact with one of the plurality of the word lines.

* * * * *